(12) United States Patent
Han et al.

(10) Patent No.: US 9,347,650 B2
(45) Date of Patent: May 24, 2016

(54) LIGHT EMITTING APPARATUS USING MEDIUM LAYER BETWEEN WAVELENGTH CONVERSION LAYER AND TRANSPARENT LAYER

(71) Applicant: LG INNOTEK CO., LTD., Seoul (KR)

(72) Inventors: Jae Cheon Han, Seoul (KR); Jung Myung Min, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 71 days.

(21) Appl. No.: 13/836,941

(22) Filed: Mar. 15, 2013

(65) Prior Publication Data
US 2014/0009930 A1   Jan. 9, 2014

(30) Foreign Application Priority Data
Jul. 9, 2012 (KR) .......................... 10-2012-0074659

(51) Int. Cl.
| | |
|---|---|
| *F21V 13/02* | (2006.01) |
| *H01L 25/075* | (2006.01) |
| *H01L 33/50* | (2010.01) |
| *H01L 33/56* | (2010.01) |

(52) U.S. Cl.
CPC ............ *F21V 13/02* (2013.01); *H01L 25/0753* (2013.01); *H01L 33/505* (2013.01); *H01L 33/507* (2013.01); *H01L 33/56* (2013.01); *H01L 2924/0002* (2013.01)

(58) Field of Classification Search
CPC ....... H01L 33/48; H01L 33/483; H01L 33/50; H01L 33/505; H01L 33/507; H01L 25/0753; F21V 13/02; F21V 13/00
USPC .......................... 362/231, 246; 257/88, 89, 98
See application file for complete search history.

(56) References Cited

U.S. PATENT DOCUMENTS

| | | | | |
|---|---|---|---|---|
| 7,821,194 | B2 * | 10/2010 | Negley et al. ................. | 313/498 |
| 8,106,584 | B2 * | 1/2012 | Tabuchi et al. ................ | 313/512 |
| 2009/0147513 | A1 * | 6/2009 | Kolodin et al. ................ | 362/241 |
| 2009/0295265 | A1 * | 12/2009 | Tabuchi et al. ................ | 313/112 |
| 2010/0038665 | A1 | 2/2010 | Sugiura et al. | |
| 2010/0044732 | A1 | 2/2010 | Li et al. | |
| 2010/0308354 | A1 | 12/2010 | David et al. | |
| 2011/0018012 | A1 * | 1/2011 | Tanaka et al. .................. | 257/89 |

(Continued)

FOREIGN PATENT DOCUMENTS

| | | |
|---|---|---|
| JP | 2007-36199 A | 2/2007 |
| WO | 2011/007275 A1 | 1/2011 |
| WO | 2012/011528 A1 | 1/2012 |

*Primary Examiner* — Anne Hines
(74) *Attorney, Agent, or Firm* — Birch, Stewart, Kolasch & Birch, LLP

(57) ABSTRACT

A light emitting apparatus includes a first light source to generate light having a first main wavelength band, a second light source to generate light having a second main wavelength band, a first transparent layer surrounding the first and second light sources, a wavelength conversion layer disposed on the first transparent layer to convert at least one of the light having the first main wavelength band and the light having the second main wavelength band into light having a third main wavelength band, and a medium layer between the wavelength conversion layer and the first transparent layer. At least of the first or second light sources has a first refractive index, the first transparent layer has a second refractive index, the medium layer has a third refractive index, the wavelength conversion layer has a fourth refractive index, and the first to fourth refractive indexes are different from each other.

20 Claims, 14 Drawing Sheets

(56) References Cited

U.S. PATENT DOCUMENTS

2011/0205733 A1* 8/2011 Lenderink et al. ............ 362/231
2011/0309398 A1* 12/2011 Ito et al. ......................... 257/98
2012/0132944 A1* 5/2012 Hsieh et al. ..................... 257/98
2013/0240918 A1* 9/2013 Herrmann et al. .............. 257/88

* cited by examiner

LIGHT EMITTING APPARATUS USING MEDIUM LAYER BETWEEN WAVELENGTH CONVERSION LAYER AND TRANSPARENT LAYER

The present application claims priority under 35 U.S.C. §119(a) of Korean Patent Application No. 10-2012-0074659 filed on Jul. 9, 2012, which is hereby incorporated by reference in its entirety.

BACKGROUND

The embodiment relates to a light emitting apparatus.

Studies for a light emitting device, a light emitting package employing the light emitting device and a light emitting apparatus employing the light emitting device or the light emitting package have been actively pursued.

The light emitting device is a semiconductor light emitting device, which is formed of a semiconductor material, to convert electric energy into photo energy.

The light emitting device has advantages such as low power consumption, a semi-permanent life cycle, a fast response time, safety, and environment friendly requirement compared to the light source according to the related art, such as a fluorescent lamp and an incandescent bulb. Thus, many studies are being in progress in order to replace the existing light sources with the light emitting devices.

In addition, the semiconductor light emitting device is increasingly used as light sources for lighting devices, such as various lamps or street lamps, as well as light sources for display devices, such as a liquid crystal display or an electric signboard used indoors and outdoors.

In order to serve as the light source, the semiconductor light emitting device, the light emitting package or the light emitting apparatus must generate white light.

The light emitting apparatus generating the white light is extensively used in the street lamp, a backlight of the liquid crystal display and an outdoor advertisement board as a lighting device.

SUMMARY

The embodiment provides a light emitting apparatus capable of producing warm white.

The embodiment provides a light emitting apparatus capable of improving light efficiency.

The embodiment provides a light emitting apparatus capable of improving light extraction efficiency.

The embodiment provides a light emitting apparatus which can be reliably fixed.

A light emitting apparatus according to the embodiment may include a sub-mount; a first light source on the sub-mount to generate a light having a first main wavelength band in a range of about 400 nm to about 500 nm; a second light source disposed on the sub-mount to generate a light having a second main wavelength band in a range of about 600 nm to about 670 nm, the second light source spaced apart from the first light source; a first transparent layer surrounding the first and second light sources; a wavelength conversion layer on the first transparent layer to convert at least one of the light having the first main wavelength band and the light having the second main wavelength band into a light having a third main wavelength band in a range of about 500 nm to about 600 nm; and a medium layer between the wavelength conversion layer and the first transparent layer, wherein at least one of the first or second light sources may have a first refractive index, the first transparent layer may have a second refractive index, the medium layer may have a third refractive index, and the wavelength conversion layer may have a fourth refractive index, and wherein the first to fourth refractive indexes may be different from each other.

A light emitting apparatus according to the embodiment may include a sub-mount; a plurality of first light emitting packages on the sub-mount; a plurality of second light emitting packages on the sub-mount, the second light emitting packages being spaced apart from the first light emitting packages; and a second transparent layer surrounding the first and second light emitting packages on the sub-mount, wherein each of the first light emitting packages include a first light emitting device on the sub-mount to generate a light having a first main wavelength band in a range of about 400 nm to about 500 nm; a first transparent layer surrounding the first light emitting device; a wavelength conversion layer disposed on the first transparent layer to convert the light having the first main wavelength band into a light having a third main wavelength band in a range of about 500 nm to about 600 nm; and a medium layer between the wavelength conversion layer and the first transparent layer, and wherein the first light emitting device may have a first refractive index, the first transparent layer may have a second refractive index, the medium layer may have a third refractive index, and the wavelength conversion layer may have a fourth refractive index, and wherein the first to fourth refractive indexes may be different from each other.

A light emitting apparatus according to the embodiment may include a sub-mount; a plurality of light emitting packages on the sub-mount; and a second transparent layer surrounding the light emitting packages on the sub-mount, wherein each of the light emitting packages may include a first light emitting device on the sub-mount to generate a light having a first main wavelength band in a range of about 400 nm to about 500 nm; a plurality of second light emitting device on the sub-mount to generate a light having a second main wavelength band in a range of about 600 nm to about 670 nm, the second light emitting device spaced apart from the first light emitting device; a first transparent layer surrounding the first and second light emitting devices; a wavelength conversion layer disposed on the first transparent layer to convert at least one of the light having the first main wavelength band or the light having the second main wavelength band into a light having a third main wavelength band in a range of about 500 nm to about 600 nm; and a medium layer between the wavelength conversion layer and the first transparent layer, and wherein the first light emitting device may have a first refractive index, the first transparent layer may have a second refractive index, the medium layer may have a third refractive index, and the wavelength conversion layer may have a fourth refractive index, and wherein the first to fourth refractive indexes may be different from each other.

DETAILED DESCRIPTION OF THE EMBODIMENTS

Figure 1:
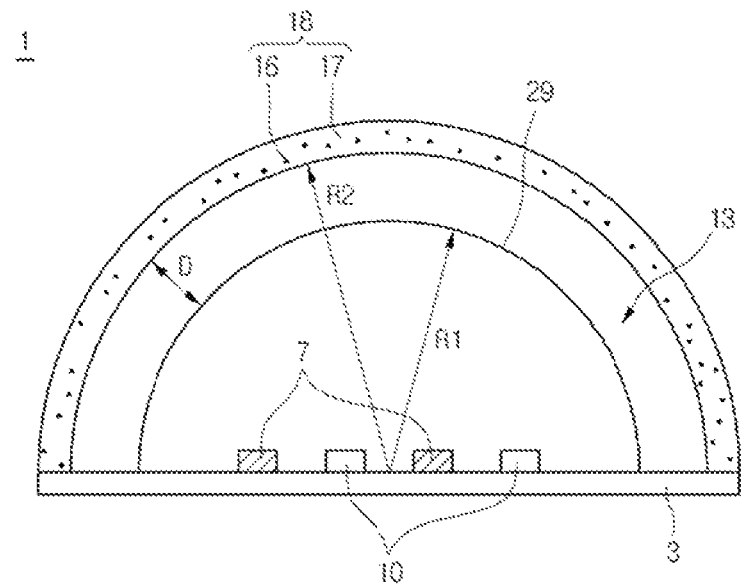
FIG. 1 is a sectional view showing a light emitting apparatus according to the first embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, embodiments will be described with reference to accompanying drawings. In the drawings, the thickness and size of each layer may be exaggerated, omitted or schematically drawn for the purpose of convenience or clarity. In addition, the size of elements does not utterly reflect an actual size.

In the following description, a substrate or a body may be referred to as a sub-mount generally known in the art and a light emitting device or a light emitting package may be referred to as a light source or a light emitting source.

In white lights, a warm white light may have a color temperature in the range of 2500 K to 4000 K.

Recently, studies are actively pursued for a light emitting apparatus capable of generating an optimum warm white light.

In general, a light may approximate to a natural light as a CRI (color rendering index) of the light is increased.

In order to obtain a higher CRI, for instance, a light source having at least two wavelength bands different from each other may be adopted.

In the following description, a light emitting apparatus for generating the warm white light having the higher CRI and the color temperature in the range of 2500 K to 4000 K will be described in detail.

FIG. 1 is a sectional view showing a light emitting apparatus according to the first embodiment.

Referring to FIG. 1, the light emitting apparatus 1 according to the first embodiment may include a substrate 3, a plurality of first and second light emitting devices 7 and 10, a transparent layer 29, a medium layer 13 and a wavelength conversion layer 18.

The substrate 3 may include an electric conductor disposed on a base substrate and an insulator disposed on the electric conductor, but the embodiment is not limited thereto. The insulator, for instance, may include a resin-based material having insulating property, but the embodiment is not limited thereto. The electric conductor may include a conductive metallic material, but the embodiment is not limited thereto. The electric conductor may include a first electric conductor to which positive (+) power is supplied and a second electric conductor to which negative (−) power is supplied. The first and second electric conductors may be electrically connected to the first and second light emitting devices 7 and 10, respectively.

The substrate 3 may include a PCB (printed circuit board), a metal core PCB, a flexible PCB or ceramic PCB, but the embodiment is not limited thereto.

The substrate 3 may further include a reflective layer disposed on the insulator and formed of a reflective material having superior reflection performance, but the embodiment is not limited thereto.

The first and second light emitting devices 7 and 10 may be disposed on the substrate 3.

The first and second light emitting devices 7 and 10 may be spaced apart from each other on the substrate 3, but the embodiment is not limited thereto.

The first and second light emitting devices 7 and 10 may be bonded onto the substrate 3 by an adhesive (not shown). The first and second light emitting devices 7 and 10 may be electrically connected to the first and second electric conductors, respectively, through a wire bonding or a flip chip bonding, but the embodiment is not limited thereto.

The first light emitting devices 7 may serve as a first light source for generating light having a first main wavelength band and the second light emitting devices 10 may serve as a second light source for generating light having a second main wavelength band, but the embodiment is not limited thereto.

For instance, the first main wavelength band may be in the range of about 400 nm to about 500 nm and the second main wavelength band may be in the range of about 600 nm to about 670 nm, but the embodiment is not limited thereto.

In this case, the wavelength conversion layer 18 may convert the light having the first main wavelength band and/or the second main wavelength band into a light having a third main wavelength band. The third main wavelength band may be in the range of about 500 nm to about 600 nm, but the embodiment is not limited thereto.

For instance, the first main wavelength band may have a peak of 450 nm, the second main wavelength band may have a peak of 615 nm, and the third main wavelength band may have a peak in the range of 550 nm to 560 nm, but the embodiment is not limited thereto.

The warm white light may be generated by mixing the light having the first main wavelength band, the light having the second main wavelength band and the light having the third main wavelength band, but the embodiment is not limited thereto.

The first and second light emitting devices 7 and 10 may include at least a first conductive semiconductor layer, an active layer and a second conductive semiconductor layer, but the embodiment is not limited thereto. The first conductive semiconductor layer, the active layer and the second conductive semiconductor layer may constitute a light emitting structure, but the embodiment is not limited thereto.

For instance, the active layer may be disposed on the first conductive semiconductor layer and the second conductive semiconductor layer may be disposed on the active layer.

The first conductive semiconductor layer, the active layer and the second conductive semiconductor layer may be formed of group II-VI semiconductor materials or group III-V compound semiconductor materials. For instance, the first conductive semiconductor layer, the active layer and the second conductive semiconductor layer may include at least one selected from the group consisting of InAlGaN, GaN, AlGaN, InGaN, AlN, InN, and AlInN, but the embodiment is not limited thereto.

The group II-VI semiconductor materials or group III-V compound semiconductor materials may have a refractive index in the range of 2.1 to 3.5, but the embodiment is not limited thereto.

For instance, the first conductive semiconductor layer may be an n type semiconductor layer including an n type dopant and the second conductive semiconductor layer may be a p type semiconductor layer including a p type dopant, but the embodiment is not limited thereto. The n type dopant includes Si, Ge or Sn and the p type dopant includes Mg, Zn, Ca, Sr or Ba, but the embodiment is not limited thereto.

First carriers (e.g., electrons) injected through the first conductive semiconductor layer are combined with second carriers (e.g., holes) injected through the second conductive semiconductor layer in the active layer, so that the active layer may emit the light having the wavelength corresponding to the difference of an energy bandgap of materials constituting the active layer.

The active layer may include one of a single quantum well structure, a multi quantum well (MQW) structure, a quantum dot structure, or a quantum wire structure. The active layer may have the stack structure in which well and barrier layers are repeatedly formed. The repetition period of the well layer and the barrier layer may vary depending on the characteristic of the light emitting device and the embodiment is not limited thereto.

For instance, the active layer may be formed in the stack structure of InGaN/GaN, InGaN/AlGaN, or InGaN/InGaN. The bandgap of the barrier layer may be greater than the bandgap of the well layer.

Although not shown in the drawing, a third conductive semiconductor layer including a conductive dopant identical to the conductive dopant of the first conductive semiconductor layer may be formed on the second conductive semiconductor layer.

In addition, a first electrode may be disposed in contact with the first conductive semiconductor layer and a second electrode may be disposed in contact with the third conductive semiconductor layer.

The first and second light emitting devices 7 and 10 may include one of a lateral structure, a flip chip structure and a vertical structure depending on the arrangement direction of the electrodes.

In the lateral structure and the flip chip structure, the first electrode may be disposed on the first conductive semiconductor layer and the second electrode may be disposed on the second conductive semiconductor layer. In detail, in the lateral structure and the flip chip structure, the first and second electrodes may be disposed in the same direction.

In the vertical structure, the first electrode may be disposed on the first conductive semiconductor layer and the second electrode may be disposed under the second conductive semiconductor layer. In detail, in the vertical structure, the first and second electrodes may be disposed in the opposite direction while at least partially overlapping with each other, but the embodiment is not limited thereto.

Figure 5:
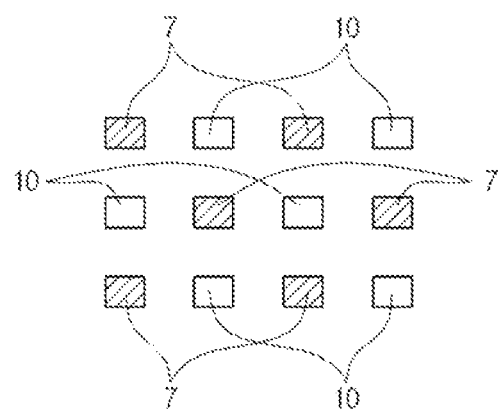
FIG. 5 is a first example view showing an arrangement of a light emitting device illustrated in FIG. 1.
Figure 6:
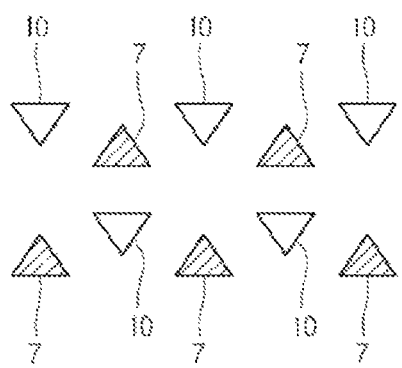
FIG. 6 is a second example view showing an arrangement of a light emitting device illustrated in FIG. 1.
Figure 7:
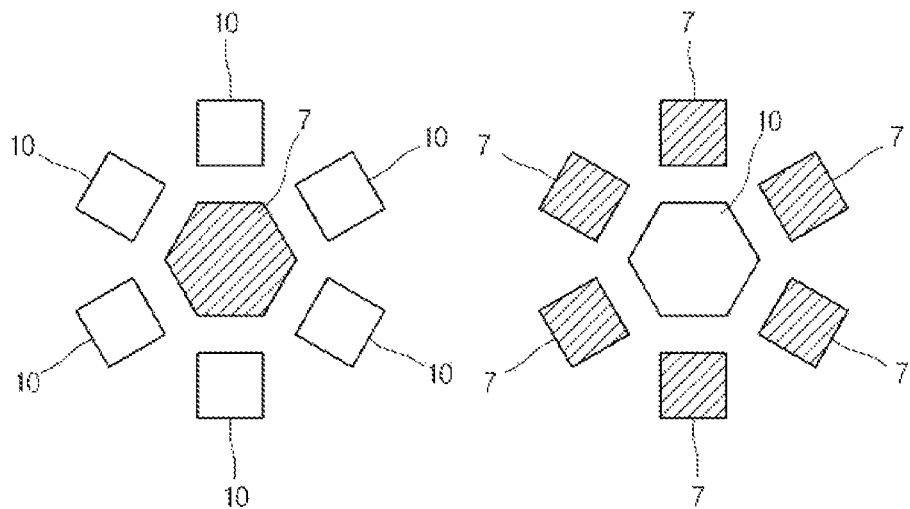
FIG. 7 is a third example view showing an arrangement of a light emitting device illustrated in FIG. 1.

As shown in FIGS. 5 to 7, the first and second light emitting devices 7 and 10 may have various arrangements, and the embodiment is not limited thereto.

As shown in FIG. 5, the first and second light emitting devices 7 and 10 may be disposed in a zigzag configuration.

The first light emitting devices 7 may be disposed at odd-numbered columns in odd-numbered rows and at even-numbered columns in even-numbered rows. That is, the first light emitting devices 7 may be alternately disposed at the odd-numbered column and the even-numbered column in each row, but the embodiment is not limited thereto.

The second light emitting devices 10 may be disposed at even-numbered columns in odd-numbered rows and at odd-numbered columns in even-numbered rows. That is, the second light emitting devices 10 may be alternately disposed at the even-numbered column and the odd-numbered column in each row, but the embodiment is not limited thereto.

When viewed from the top, the first and second light emitting devices 7 and 10 may have rectangular shapes as shown in FIG. 5, triangular shapes as shown in FIG. 6, or hexagonal shapes as shown in FIG. 7. Although not shown in the drawing, the first and second light emitting devices 7 and 10 may have polygonal shapes, such as circular shapes, elliptical shapes, lozenge shapes or square shapes, but the embodiment is not limited thereto.

As shown in FIG. 6, when viewed from the top, the first and second light emitting devices 7 and 10 may have the triangular shapes and may be alternately disposed. One side of the first light emitting device 7 may face one side of the second light emitting device 10, but the embodiment is not limited thereto.

As shown in FIG. 7, when viewed from the top, the first emitting device 7 may have the hexagonal shape and the second light emitting devices 10 may be disposed such that one side of the second light emitting devices 10 may face sides of the hexagonal first emitting device 7, respectively.

In addition, when viewed from the top, the second emitting device 10 may have the hexagonal shape and the first light emitting devices 7 may be disposed such that one side of the first light emitting devices 7 may face sides of the hexagonal second emitting device 10, respectively.

For instance, a plurality of second light emitting devices 10 may be disposed to surround the hexagonal first emitting device 7, another hexagonal second light emitting device 10 may be disposed adjacent to the hexagonal first emitting device 7 and a plurality of first light emitting devices 7 may be disposed to surround the second light emitting device 10. In other words, the hexagonal first and second light emitting devices 7 and 10 may be alternately disposed, a plurality of the second light emitting devices 10 may be disposed around the hexagonal first light emitting device 7 and a plurality of first light emitting devices 7 may be disposed around the hexagonal second light emitting device 10, but the embodiment is not limited thereto.

The second and first light emitting devices 10 and 7 that surround the hexagonal first and second light emitting device 7 and 10, respectively, may have the rectangular shapes, but the embodiment is not limited thereto.

Referring to FIG. 1, the transparent layer 29 may be disposed on the substrate 3 to surround the first and second light emitting devices 7 and 10.

In detail, the transparent layer 29 may be disposed between the first and second light emitting devices 7 and 10 and/or on the first and second light emitting devices 7 and 10.

The transparent layer 29 is attached to the substrate 3 while surrounding the first and second light emitting devices 7 and 10. Thus, the first and second light emitting devices 7 and 10 are securely fixed to the substrate 3 so that the first and second light emitting devices 7 and 10 can be prevented from being detached from the substrate 3 by external impact and can be prevented from being contaminated or eroded by for instance, air of the medium layer 13.

The transparent layer 29 may have the refractive index in the range of 1.4 to 2.0. The refractive index of the transparent layer 29 may be lower than the refractive index of the first and second light emitting devices by 0.1 to 1.5.

The transparent layer 29 may be formed of a silicone-based resin or an epoxy-based resin having superior adhesive and thermal conductive properties, but the embodiment is not limited thereto.

The silicon resin may have the refractive index of 1.45 to 1.60 and the epoxy-based resin may have the refractive index of 1.5, but the embodiment is not limited thereto.

Figure 2:
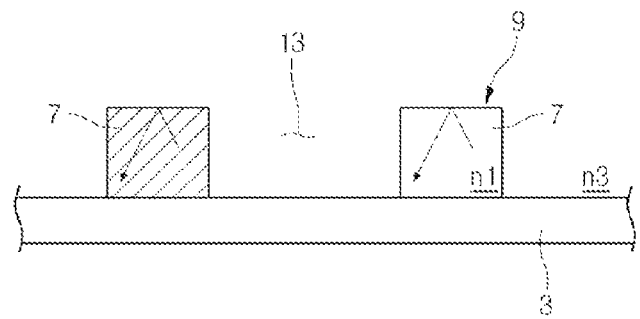
FIG. 2 is a view showing a traveling path of light when a medium layer is disposed on first and second light emitting devices.

FIG. 2 is a view showing a traveling path of light when the medium layer is disposed on the first and second light emitting devices.

As shown in FIG. 2, when the transparent layer 29 is not disposed between the first and second light emitting devices 7 and 10, that is, when the medium layer 13 directly contacts the first and second light emitting devices 7 and 10, there is great difference in refractive index between the first and second light emitting devices 7 and 10 and the medium layer 13 (n1-n3) and the light travels from the first and second light emitting devices 7 and 10 having the higher refractive index (n1) to the medium layer 13 having the lower refractive index (n3). Thus, the light generated from the first and second light emitting devices 7 and 10 may be totally reflected from a boundary surface 9 that is formed between the first and second light emitting devices 7 and 10 and the medium layer 13, so that the light is reflected into the interior of the first and second light emitting devices 7 and 10.

In general, the light travels from a first medium having the higher refractive index to a second medium having the lower refractive index. When there is great difference in refractive index between the first medium and the second medium, the light may not travel from the first medium to the second medium, but may be totally reflected into the first medium.

For instance, if the medium layer 13 is air, the air may have the refractive index (n3) of 1.0003. In this case, the difference in refractive index between the first and second light emitting devices 7 and 10 and the medium layer 13 (n1-n3) may be in the range of 1.0997 to 1.8997.

Therefore, the light generated from the first and second light emitting devices 7 and 10 may not be output to the medium layer 13, so that the light extraction efficiency may be reduced, resulting the reduction of the light efficiency.

In order to solve the above problem, according to the first embodiment, the transparent layer 29 may be disposed between the first and second light emitting devices 7 and 10 the medium layer 13 so as to attenuate the difference in refractive index between the first and second light emitting devices 7 and 10 and the medium layer 13 (n1-n3).

The refractive index (n2) of the transparent layer 29 may be lower than the refractive index (n1) of the first and second light emitting devices 7 and 10 and higher than the refractive index (n3) of the medium layer 13, but the embodiment is not limited thereto. That is, the transparent layer 29 may have the refractive index (n2) between the refractive index (n1) of the first and second light emitting devices 7 and 10 and the refractive index (n3) of the medium layer 13.

For instance, the transparent layer 29 may have the refractive index (n2) in the range of 1.4 to 1.6, but the embodiment is not limited thereto.

Figure 3:
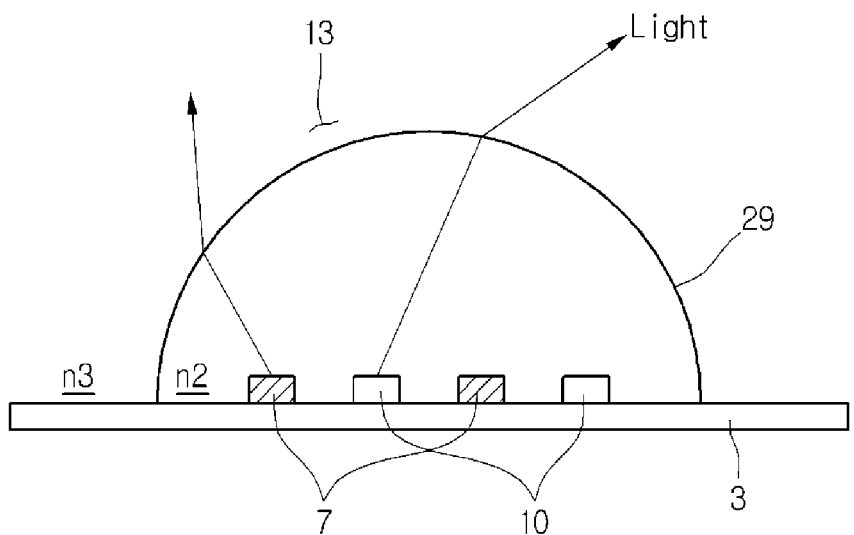
FIG. 3 is a view showing a traveling path of light when a transparent layer is disposed between a medium layer and first and second light emitting devices according to the first embodiment.

FIG. 3 is a view showing a traveling path of light when the transparent layer 29 is disposed between the medium layer 13 and the first and second light emitting devices 7 and 10 according to the first embodiment.

For instance, as shown in FIG. 3, since the transparent layer 29 attenuates the difference in refractive index between the first and second light emitting devices 7 and 10 and the medium layer 13, the light generated from the first and second light emitting devices 7 and 10 can be readily incident into the medium layer 13 through the transparent layer 29.

In detail, since the difference in refractive index between the first and second light emitting devices 7 and 10 and the medium layer 13 (n1-n3) is lower than the difference in refractive index between the first and second light emitting devices 7 and 10 and the transparent layer 29 (n1-n2), the light generated from the first and second light emitting devices 7 and 10 can be readily incident into the transparent layer 29. In addition, since the difference in refractive index between the first and second light emitting devices 7 and 10 and the medium layer 13 (n1-n3) is lower than the difference in refractive index between the transparent layer 29 and the medium layer (n2-n3), the light of the transparent layer 29 can be readily incident into the medium layer 13. Therefore, the light generated from the first and second light emitting devices 7 and 10 can be readily incident into the medium layer 13 because the transparent layer 29 attenuates the difference in refractive index between the first and second light emitting devices 7 and 10 and the medium layer 13, so that the light extraction efficiency can be increased and the light efficiency can be improved.

When viewed from the top, the transparent layer 29 may have a circular shape or an elliptical shape, but the embodiment is not limited thereto.

When viewed from the side surface, the transparent layer 29 may have a hemispheric shape, but the embodiment is not limited thereto.

The transparent layer 29 may have a hemispheric shape having a first radius $R_1$. The first radius $R_1$ may be defined as a distance between the center of the transparent layer 29, that is, the center of the substrate 3 and the top surface of the transparent layer 29, but the embodiment is not limited thereto.

The bottom surface of the transparent layer 29 may closely adhere to the first and second light emitting devices 7 and 10, but the embodiment is not limited thereto.

The wavelength conversion layer 18 may be disposed on the medium layer 13. The wavelength conversion layer 18 is spaced apart from the first and second light emitting devices 7 and 10 and may be fixed or attached to the substrate 3.

Although not shown in the drawing, the wavelength conversion layer 18 may be attached to the substrate 3 by using an adhesive, but the embodiment is not limited thereto. The adhesive may be formed of a silicone-based resin or an epoxy-based resin having superior adhesive and thermal conductive properties, but the embodiment is not limited thereto.

The wavelength conversion layer 18 may be prepared in the form of a hemispheric cap to prevent the light loss and to improve the light efficiency by suppressing difference in light path, but the embodiment is not limited thereto.

The wavelength conversion layer 18 may be prepared in the form of a hemispheric cap having a second radius $R_2$.

The second radius $R_2$ may be defined as a distance between the center of the wavelength conversion layer 18, that is, the center of the substrate 3 and the top surface of the wavelength conversion layer 18, but the embodiment is not limited thereto.

Since the wavelength conversion layer 18 has the second radius $R_2$, the light generated from the first and second light emitting devices 7 and 10 disposed in the vicinity of the center the substrate 3 may have the same path to the wavelength conversion layer 18. That is, the same light path is formed between the first and second light emitting devices 7 and 10 and the wavelength conversion layer 18, so the light loss may not occur due to a difference between the light paths and the light efficiency may be improved.

The shape of the wavelength conversion layer 18 according to the first embodiment may be variously modified depending on applications.

If the transparent layer 29 has the elliptical shape when viewed from the top, the medium layer 13 and the wavelength conversion layer 18 may have the elliptical shape, but the embodiment is not limited thereto. In this case, each of the transparent layer 29, the medium layer 13 and the wavelength conversion layer 18 may have a long axis and a short axis. The first radius $R_2$ may be applied to the short axis of the transparent layer 29 and the second radius $R_2$ may be applied to the short axis of the wavelength conversion layer 18, but the embodiment is not limited thereto.

The wavelength conversion layer 18 may convert the light having the first main wavelength band generated from the first light emitting device 7 or the light having the second main wavelength band generated from the second light emitting device 10 into the light having the third main wavelength band.

The wavelength conversion layer 18 may include a transparent film 17 and a plurality of wavelength conversion particles 16 dispersed in the transparent film 17, but the embodiment is not limited thereto.

The wavelength conversion particles 16 may be prepared as a single wavelength conversion particle or at least two wavelength conversion particles different from each other.

For instance, the wavelength conversion particles 16 may include first and second wavelength conversion particles different from each other.

The transparent film 17, for instance, may include one selected from the group consisting of a silicone-based resin, an epoxy-based resin, a polycarbonate-based resin and glass, which have superior light transmittance, thermal endurance and thermal conductivity, but the embodiment is not limited thereto.

For instance, the silicone-based resin may have the refractive index of 1.45 to 1.60, the epoxy-based resin may have the refractive index of 1.5, the polycarbonate-based resin may have the refractive index of 1.59 and the glass may have the refractive index of 1.89, but the embodiment is not limited thereto.

The wavelength conversion particles 16, for instance, may include phosphors formed of fluorescent materials, but the embodiment is not limited thereto.

The fluorescent materials may include YAG-based materials or TAG-based materials, but the embodiment is not limited thereto. For instance, the YAG-based materials may include YAG:Ce and the TAG-based materials may include TAG:Tb.

In addition, the fluorescent materials may include silicate-based materials. The silicate-based materials may include $Sr_{4-x}Mg_yBa_zSi_2O_8:Eu^{2+}_x$ ($0<x<1$, $0\le y\le1$, $0\le z\le1$) or $Sr_{3-x}SiO_5:Eu^{2+}_x$ ($0<x\le1$), but the embodiment is not limited thereto.

For instance, at least one of the YAG-based materials, TAG-based materials and/or silicate-based materials may be dispersed in the transparent film 17 as a phosphor, but the embodiment is not limited thereto.

The wavelength conversion particles 16 may be randomly dispersed in the transparent film 17, but the embodiment is not limited thereto.

The wavelength conversion particles 16 may convert the light having the first main wavelength band generated from the first light emitting device 7 and/or the light having the second main wavelength band generated from the second light emitting device 10 into the light having the third main wavelength band, but the embodiment is not limited thereto.

The light having the first main wavelength band generated from the first light emitting device 7 may pass through the transparent film 19 of the wavelength conversion layer 18 or may be converted into the light having the third main wavelength band by the wavelength conversion particles 16.

The light having the second main wavelength band generated from the second light emitting device 10 may pass through the transparent film 19 of the wavelength conversion layer 18 or may be converted into the light having the third main wavelength band by the wavelength conversion particles 16.

Therefore, the light having the first main wavelength band, the light having the second main wavelength band, and the light having the third main wavelength band, which are output through the wavelength conversion layer 18, are mixed with each other to generate the light having the warm white.

Although not shown in the drawing, dispersion particles may be further dispersed in the transparent film 17 in addition to the wavelength conversion particles 16, but the embodiment is not limited thereto.

The dispersion particles may include one selected from the group consisting of $TiO_2$, $Al_2O_3$, $BaCO_3$, $BaSO_4$ and $SiO_2$, but the embodiment is not limited thereto.

Since the dispersion particles are dispersed in the transparent film 17, the light of the wavelength conversion layer 18 may be scattered or dispersed when the light is output from the wavelength conversion layer 18 so that the light extraction efficiency can be more improved.

The wavelength conversion layer 18, in detail, the transparent film 17 allows the light of the medium layer 13 to be more easily incident into the wavelength conversion layer 18 while preventing the light of the wavelength conversion layer 18 from being incident again into the medium layer 13.

That is, the wavelength conversion layer 18 may have the refractive index higher than that of the medium layer 13.

For instance, the wavelength conversion layer 18 may have the refractive index in the range of 1.4 to 2.0, but the embodiment is not limited thereto.

The wavelength conversion layer 18 may have the refractive index equal to or different from that of the transparent layer 29.

The wavelength conversion layer 18 may have the refractive index equal to or higher than that of the transparent layer 29, but the embodiment is not limited thereto.

The wavelength conversion layer 18 may include the same material as a material of the transparent layer 29, but the embodiment is not limited thereto.

For instance, in the case that the wavelength conversion layer 18 contacts the transparent layer 29, since the wavelength conversion layer 18 has the refractive index similar to that of the transparent layer 29, the light of the transparent layer 29 may be reflected from the wavelength conversion layer 18, other than incident into the wavelength conversion layer 18, so that the light may be incident again into the transparent layer 29.

In this case, if the wavelength conversion layer 18 is spaced apart from the transparent layer 29 while interposing the medium layer 13 therebetween, the light incident into the medium layer from the transparent layer 29 may be readily incident into the wavelength conversion layer 18 having the refractive index significantly higher than the refractive index of the medium layer 13. Due to the above structure, the light can be incident into the wavelength conversion layer 18 with higher probability, so that the wavelength conversion efficiency in the wavelength conversion layer 18 can be maximized.

The medium layer 13 may be disposed between the transparent layer 29 and the wavelength conversion layer 18.

The medium layer 13 has the refractive index lower than the refractive index of the transparent layer 29 or the wavelength conversion layer 18, but the embodiment is not limited thereto.

For instance, the medium layer 13 has the refractive index in the range of 1 to 1.3, but the embodiment is not limited thereto.

The medium layer 13 may include one selected from the group consisting of a vacuum medium, air and liquid carbon dioxide, but the embodiment is not limited thereto.

For instance, the vacuum medium may have the refractive index of 1.00, the air may have the refractive index of 1.0003, and the liquid carbon dioxide may have the refractive index of 1.2.

As described above, since the refractive index of the medium layer 13 is lower than that of the wavelength conversion layer 18, the light of the medium layer 13 may be easily incident into the wavelength conversion layer 18, but the light of the wavelength conversion layer 18 may be totally reflected from the boundary surface between the wavelength conversion layer 18 and the medium layer 13, other than incident into the medium layer 13, so that the light of the wavelength conversion layer 18 may be incident again into the wavelength conversion layer 18.

That is, since the medium layer 13 is disposed under the wavelength conversion layer 18, the light of the medium layer 13 may be more easily incident into the wavelength conversion layer 18 while preventing the light of the wavelength conversion layer 18 from being incident into the medium layer 13. Thus, a greater amount of light may exist in the wavelength conversion layer 18 so that the wavelength conversion efficiency in the wavelength conversion layer 18 may be maximized The medium layer 13 may have a hemispheric shape when viewed from the side surface, but the embodiment is not limited thereto.

Since the wavelength conversion layer 18 is spaced apart from the first and second light emitting devices 7 and 10 by the medium layer 13, heat generated from the first and second light emitting devices 7 and 10 may not be transferred to the wavelength conversion layer 18, so the wavelength conversion layer 18 may not be damaged by heat. In addition, the degradation of the wavelength conversion characteristic of the wavelength conversion particles 16 dispersed in the wavelength conversion layer 18, which may be caused by the heat generated from the first and second light emitting devices 7 and 10, can be prevented.

Since the wavelength conversion layer 18 is fixed to the substrate 3, heat of the wavelength conversion layer 18 can be readily dissipated to the outside through the substrate 3 even if the heat is transferred to the wavelength conversion layer 18 through air.

Although not shown in the drawing, the top surface of the wavelength conversion layer 18 may be formed with a roughness structure or a texture to improve the light extraction efficiency, but the embodiment is not limited thereto.

As described above, the transparent layer 29 may have the first radius $R_1$ and the wavelength conversion layer 18 may the second radius $R_2$.

Therefore, the medium layer 13 may have a width D corresponding to a distance between the second radius $R_2$ of the wavelength conversion layer 18 and the first radius $R_1$ of the transparent layer 29. The width D may be in the range of 0.5 mm to 50 mm, but the embodiment is not limited thereto.

In detail, the width D may be defined as a distance between the bottom surface of the wavelength conversion layer 18 and the top surface of the transparent layer 29. The width D may be uniformly formed over the whole area between the bottom surface of the wavelength conversion layer 18 and the top surface of the transparent layer 29, but the embodiment is not limited thereto.

If the width D is uniformly formed over the whole area between the bottom surface of the wavelength conversion layer 18 and the top surface of the transparent layer 29, the light path from the top surface of the transparent layer 29 to the bottom surface of the wavelength conversion layer 18 is uniform, so the light loss can be prevented and the light efficiency can be improved.

Figure 8:
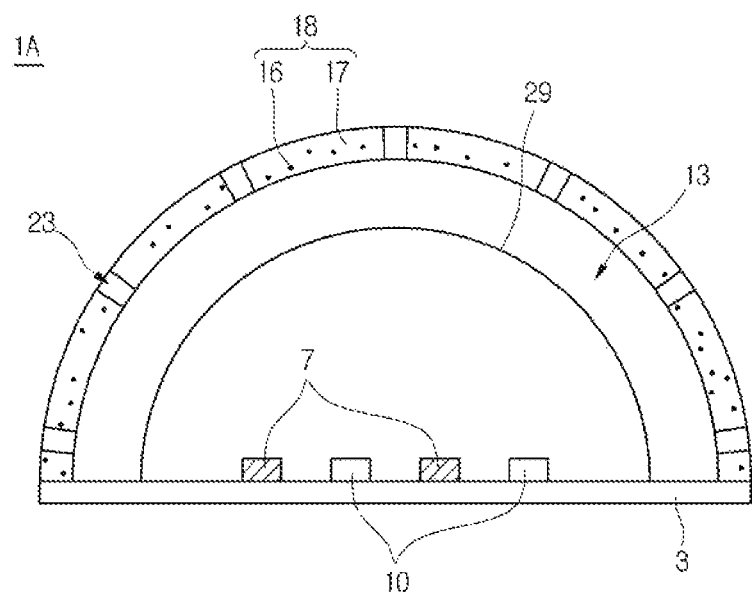
FIG. 8 is a sectional view showing a light emitting apparatus according to the second embodiment.

FIG. 8 is a sectional view showing a light emitting apparatus according to the second embodiment.

The second embodiment is substantially identical to the first embodiment except for a plurality of holes 23 formed in the wavelength conversion layer 18.

In the following description of the second embodiment, reference numerals assigned to the elements of the first embodiment will be used to refer to the elements of the second embodiment if they have the same functions and detailed description thereof will be omitted.

The description of the first embodiment may be adopted in the second embodiment even if it is omitted in the second embodiment and the contents omitted in the second embodiment may be easily comprehended by referring to the first embodiment.

Referring to FIG. 8, the light emitting apparatus 1A according to the second embodiment may include a substrate 3, a plurality of first and second light emitting devices 7 and 10, a transparent layer 29, a medium layer 13 and a wavelength conversion layer 18.

The wavelength conversion layer 18 may be prepared in the form of a hemispheric cap, but the embodiment is not limited thereto.

The wavelength conversion layer 18 may include a plurality of holes 23 that are spaced apart from each other.

The holes 23 may be formed through the bottom surface and the top surface of the wavelength conversion layer 18.

The holes 23 may have an area corresponding to 10% to 30% with respect to the whole area of the wavelength conversion layer 18, but the embodiment is not limited thereto.

If the holes 23 have an area exceeding 30% with respect to the whole area of the wavelength conversion layer 18, the wavelength conversion area is reduced in the wavelength conversion layer 18 so that the wavelength conversion efficiency may be lowered.

Meanwhile, the holes 23 may have the same diameter or different diameters, but the embodiment is not limited thereto. In addition, the holes 23 may be regularly or randomly spaced apart from each other, but the embodiment is not limited thereto.

Thus, the light that reaches the holes 23 of the wavelength conversion layer 18 from the first and second light emitting devices 7 and 10 by way of the medium layer 13 can be output to the outside through the holes 23.

According to the second embodiment, the holes 23 are formed in the wavelength conversion layer 18 so that the light extraction efficiency can be improved.

Figure 9:
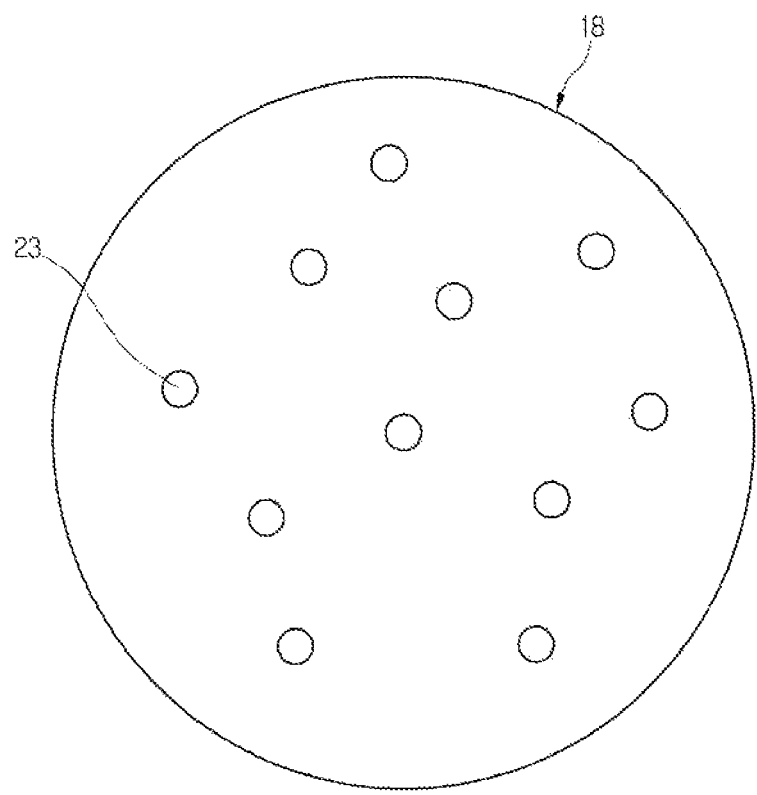
FIG. 9 is a plane view of a wavelength conversion layer illustrated in FIG. 8.

As shown in FIG. 9, the holes 23 may have circular shapes when viewed from the top, but the embodiment is not limited thereto. That is, the holes 23 may have triangular shapes, rectangular shapes, star shapes or lozenge shapes.

The holes 23 may have the same size or same diameter as shown in FIG. 9, or the holes 23 may have different sizes or different diameters.

For instance, the holes 23 formed in the center region of the wavelength conversion layer 18 may have relatively small sizes or diameters and the holes 23 formed in the peripheral region of the wavelength conversion layer 18 may have relatively large sizes or diameters.

In addition, the sizes or diameters of the holes 23 may be gradually enlarged linearly or nonlinearly from the center region of the wavelength conversion layer 18 to the peripheral region of the wavelength conversion layer 18. The holes 23 formed in the peripheral region of the wavelength conversion layer 18, in which a smaller amount of light is output, may have the sizes larger than the sizes of the holes 23 formed in the center region of the wavelength conversion layer 18, in which a greater amount of light is output, in such a manner that a greater amount of light can be extracted in the peripheral region of the wavelength conversion layer 18. In this case, the light can be uniformly output through the whole area of the wavelength conversion layer 18 so that the uniform light brightness can be ensured.

For instance, the holes 23 may be formed only in the peripheral region of the wavelength conversion layer 18 without being formed in the center region of the wavelength conversion layer 18.

Meanwhile, when the medium layer 13 is formed of air, the air may be circulated between the medium layer 13 and the outside due to the holes 23 formed in the wavelength conversion layer 18, so that the air density in the medium layer 13 may vary. In order to solve the above problem, a transparent layer formed on a resin material can be formed instead of the medium layer. That is, the transparent layer may be formed on the substrate 3 to surround the first and second light emitting devices 7 and 10 and the wavelength conversion layer 18 may be disposed on the transparent layer while adhering to the transparent layer. The transparent layer may include a silicone-based resin or an epoxy-based resin, but the embodiment is not limited thereto. The transparent layer may have the refractive index lower than the refractive index of the transparent layer 29 and the wavelength conversion layer 18.

For instance, the transparent layer that substitutes for the medium layer 13 may have the refractive index in the range of 1.1 to 1.3.

Figure 10:
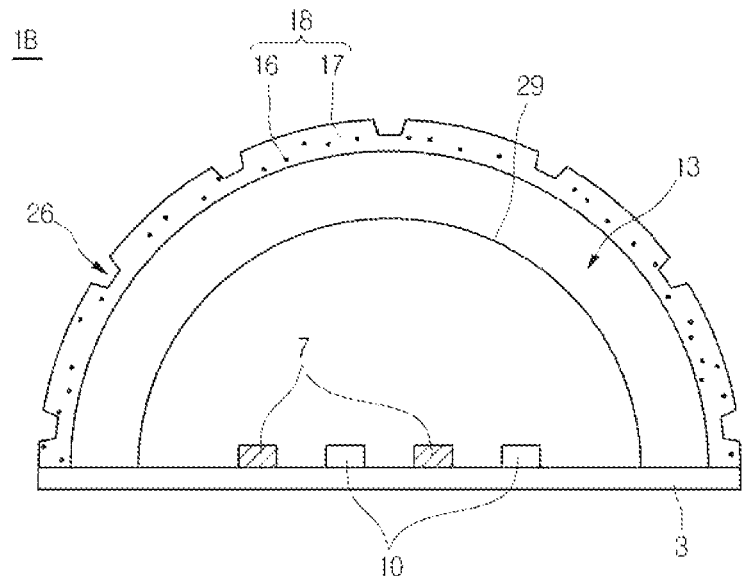
FIG. 10 is a sectional view showing a light emitting apparatus according to the third embodiment.

FIG. 10 is a sectional view showing a light emitting apparatus according to the third embodiment.

The third embodiment is substantially identical to the first embodiment except for a plurality of grooves 26 formed in the wavelength conversion layer 18.

In the following description of the third embodiment, reference numerals assigned to the elements of the first embodiment will be used to refer to the elements of the third embodiment if they have the same functions and detailed description thereof will be omitted.

The description of the first embodiment may be adopted in the third embodiment even if it is omitted in the third embodiment and the contents omitted in the third embodiment may be easily comprehended by referring to the first embodiment.

Referring to FIG. 10, the light emitting apparatus 1B according to the third embodiment may include a substrate 3, a plurality of first and second light emitting devices 7 and 10, a transparent layer 29, a medium layer 13 and a wavelength conversion layer 18.

The wavelength conversion layer 18 may be prepared in the form of a hemispheric cap, but the embodiment is not limited thereto.

The wavelength conversion layer 18 may include a plurality of grooves 26 that are spaced apart from each other.

The grooves 26 may have concave shapes, which are concaved inward, that is, concaved downward from the top surface of the wavelength conversion layer 18.

A transparent film 17 having a predetermined thickness may be formed between the bottom surface of the groove 26 and the bottom surface of the wavelength conversion layer 18.

A first thickness between the bottom surface of the groove 26 and the bottom surface of the wavelength conversion layer 18 may be smaller than a second thickness between the top surface and the bottom surface of the wavelength conversion layer 18.

In addition, although not shown in the drawing, the grooves 26 may have concave shapes, which are concaved inward, that is, concaved upward from the bottom surface of the wavelength conversion layer 18.

The grooves 26 may have an area corresponding to 10% to 30% based on the whole area of the wavelength conversion layer 18, but the embodiment is not limited thereto.

If the grooves 26 have an area exceeding 30% based on the whole area of the wavelength conversion layer 18, the wavelength conversion area is reduced in the wavelength conversion layer 18 so that the wavelength conversion efficiency may be lowered.

According to the third embodiment, the grooves 26 are formed in the wavelength conversion layer 18 so that the light extraction efficiency can be improved.

The grooves 26 may have circular shapes when viewed from the top, but the embodiment is not limited thereto. That is, the grooves 26 may have triangular shapes, rectangular shapes, star shapes or lozenge shapes.

The grooves 26 may be concaved down from the top surface of the wavelength conversion layer 18.

The grooves 26 may have the same size or same diameter or may have different sizes or different diameters.

For instance, the grooves 26 formed in the center region of the wavelength conversion layer 18 may have relatively small sizes or diameters and the grooves 26 formed in the peripheral region of the wavelength conversion layer 18 may have relatively large sizes or diameters.

In addition, the sizes or diameters of the grooves 26 may be gradually enlarged linearly or nonlinearly from the center region of the wavelength conversion layer 18 to the peripheral region of the wavelength conversion layer 18. The grooves 26 formed in the peripheral region of the wavelength conversion layer 18, in which a smaller amount of light is output, may have the sizes larger than the sizes of the grooves 26 formed in the center region of the wavelength conversion layer 18, in which a greater amount of light is output, in such a manner that a greater amount of light can be extracted in the peripheral region of the wavelength conversion layer 18. In this case, the light can be uniformly output through the whole area of the wavelength conversion layer 18 so that the uniform light brightness can be ensured.

For instance, the grooves 26 may be formed only in the peripheral region of the wavelength conversion layer 18 without being formed in the center region of the wavelength conversion layer 18.

Meanwhile, the grooves 26 may have the same depth or different depths.

For instance, the depth of the grooves 26 in the peripheral region of the wavelength conversion layer 18 may be greater than the depth of the grooves 26 in the center region of the wavelength conversion layer 18.

In contrast, the depth of the grooves 26 in the center region of the wavelength conversion layer 18 may be greater than the depth of the grooves 26 in the peripheral region of the wavelength conversion layer 18.

Meanwhile, although not shown in the drawing, protrusions may be formed in place of the grooves 26, but the embodiment is not limited thereto. The protrusions may protrude upward from the top surface of the wavelength conversion layer 18 or may protrude downward from the bottom surface of the wavelength conversion layer 18.

The shape, size and interval of the protrusions are similar to those of the grooves 26.

Figure 11:
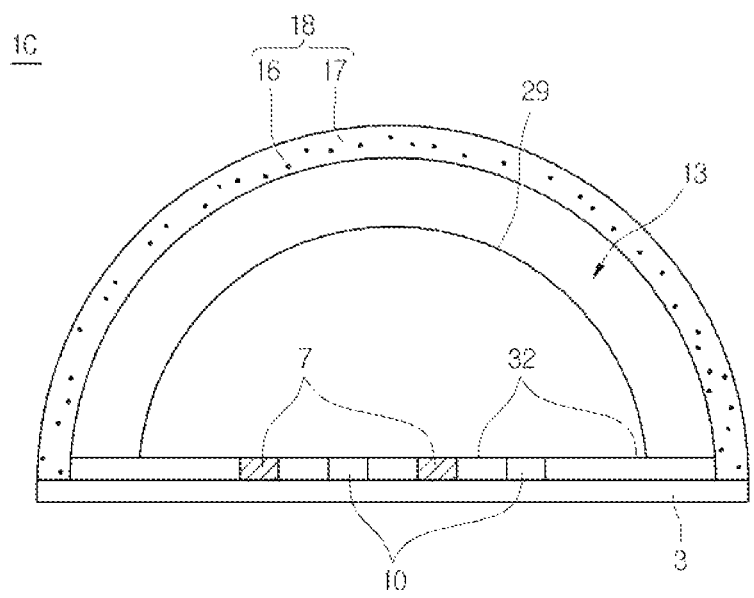
FIG. 11 is a sectional view showing a light emitting apparatus according to the fourth embodiment.

FIG. 11 is a sectional view showing a light emitting apparatus according to the fourth embodiment.

The fourth embodiment is substantially identical to the first embodiment except for a diffusion layer 32 disposed between the first and second light emitting devices 7 and 10.

In the following description of the fourth embodiment, reference numerals assigned to the elements of the first embodiment will be used to refer to the elements of the fourth embodiment if they have the same functions and detailed description thereof will be omitted.

The description of the first embodiment may be adopted in the fourth embodiment even if it is omitted in the fourth embodiment and the contents omitted in the fourth embodiment may be easily comprehended by referring to the first embodiment.

Referring to FIG. 11, the light emitting apparatus 1C according to the fourth embodiment may include a substrate 3, a plurality of first and second light emitting devices 7 and 10, a transparent layer 29, a medium layer 13 and a wavelength conversion layer 18.

A diffusion layer 32 may be disposed between the transparent layer 29 and the substrate 3. That is, the diffusion layer 32 may be disposed between the bottom surface of the transparent layer 29 and the top surface of the substrate 3. In detail, the bottom surface of the diffusion layer 32 can contact the top surface of the substrate 3 and the top surface of the diffusion layer 32 can contact the bottom surface of the transparent layer 29, but the embodiment is not limited thereto.

The diffusion layer 32 can contact side surfaces of the first and second light emitting devices 7 and 10. In detail, the diffusion layer 32 may be disposed on a region (hereinafter, referred to as a second region) of the substrate 3 except for a first region of the substrate 3 where the first and second light emitting devices 7 and 10 are attached. That is, the diffusion layer 32 may be disposed on the second region of the substrate 3.

A side surface of the diffusion layer 32 can contact an inner surface of the wavelength conversion layer 18 that is fixed to the substrate 3.

The top surface of the diffusion layer 32 may be disposed on the same plane with the top surface of the first and second light emitting devices 7 and 10 or higher/lower than the top surface of the first and second light emitting devices 7 and 10, but the embodiment is not limited thereto. Thus, the whole area of the side surfaces of the first and second light emitting devices 7 and 10 can contact the diffusion layer 32.

For instance, the top surface of the diffusion layer 32 may be located at a half of the side surface of the first and second light emitting devices 7 and 10, but the embodiment is not limited thereto.

The diffusion layer 32 may include a transparent film and a plurality of dispersion particles dispersed in the transparent film, but the embodiment is not limited thereto.

The transparent film may include one selected from the group consisting of a silicone-based resin, a white epoxy-based resin, and PTFE (polytetrafluoroethylene), which have superior electric insulating property, thermal endurance and thermal conductivity, but the embodiment is not limited thereto.

The dispersion particles may include one selected from the group consisting of $TiO_2$, $Al_2O_3$, $BaCO_3$, $BaSO_4$ and $SiO_2$, but the embodiment is not limited thereto.

The dispersion particles may have superior dispersion property with respect to the light having the first main wavelength band (about 400 nm to about 500 nm) generated from the first light emitting device 7.

In general, if the light having the first main wavelength band (about 400 nm to about 500 nm) reaches the second light emitting device 10 that generates the light having the second main wavelength band (about 600 nm to about 670 nm), the light having the first main wavelength band is absorbed in the second light emitting device 10, so the quantity of the light having the first main wavelength band may be reduced.

According to the fourth embodiment, the diffusion layer 32 closely adheres to the side surface of the first light emitting device 7. Thus, the light having the first main wavelength band, which travels toward the side surface of the first light emitting device 7, may be scattered, dispersed or reflected by the diffusion layer 32 so that the light does not reach the second light emitting device 10. Accordingly, the quantity of the light having the first main wavelength band generated from the first light emitting device 7 may not be reduced.

Figure 12:
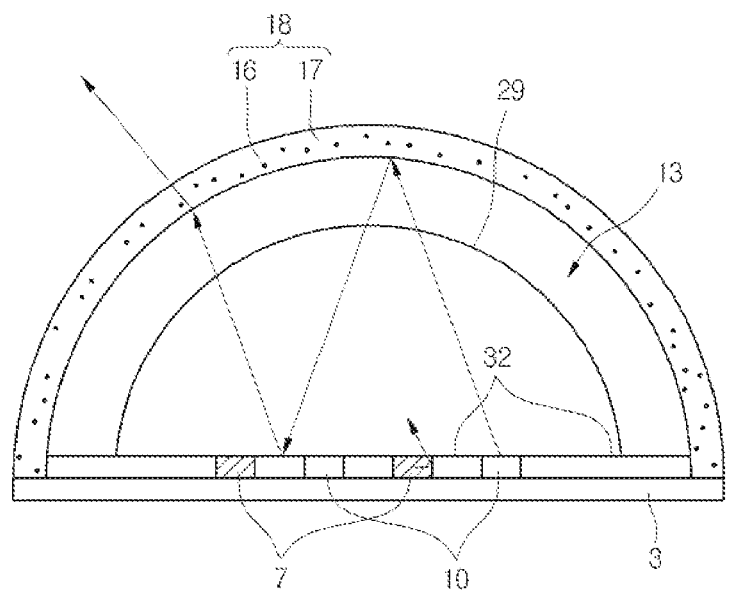
FIG. 12 is a view showing a traveling path of light according to the fourth embodiment.

As shown in FIG. 12, the light having the first main wavelength band generated from the first light emitting device 7 or the light having the second main wavelength band generated from the second light emitting device 10 may be output to the outside through the wavelength conversion layer 18 by way of the medium layer 13 or may be reflected from the wavelength conversion layer 18 so that the light may travel in the downward direction by way the medium layer 13.

The light traveling in the downward direction may be again scattered, dispersed or reflected by the diffusion layer 32 so that the light may travel in the upward direction.

According to the fourth embodiment, the light, which is generated from the first and second light emitting devices 7 and 10 and reflected by the wavelength conversion layer 18 to travel in the downward direction, may be again scattered, dispersed or reflected in the upward direction by the diffusion layer 32, so that the light loss caused by the absorption of light in the substrate 3 may be minimized, thereby improving the light efficiency.

Figure 13:
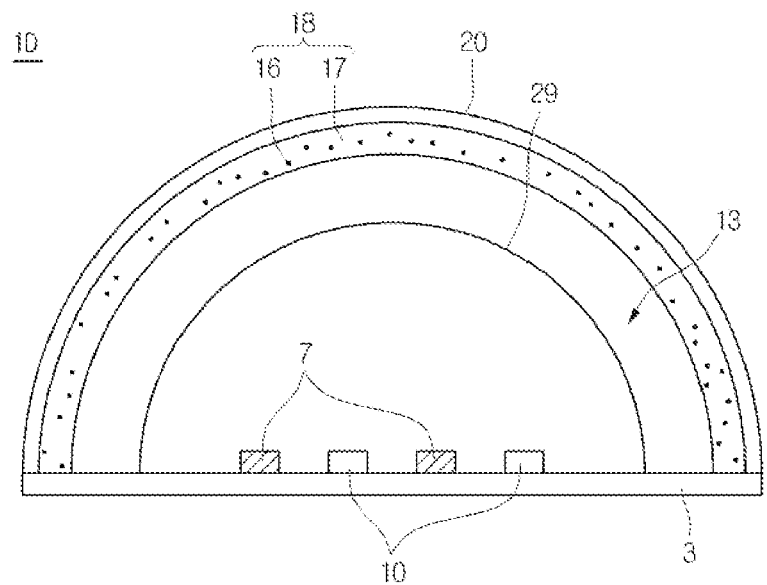
FIG. 13 is a sectional view showing a light emitting apparatus according to the fifth embodiment.

FIG. 13 is a sectional view showing a light emitting apparatus according to the fifth embodiment.

The fifth embodiment is substantially identical to the first embodiment except for a transparent layer 20 disposed on a wavelength conversion layer 18.

In the following description of the fifth embodiment, reference numerals assigned to the elements of the first embodiment will be used to refer to the elements of the fifth embodiment if they have the same functions and detailed description thereof will be omitted.

The description of the first embodiment may be adopted in the fifth embodiment even if it is omitted in the fifth embodiment and the contents omitted in the fifth embodiment may be easily comprehended by referring to the first embodiment.

Referring to FIG. 13, the light emitting apparatus 1D according to the fifth embodiment may include a substrate 3, a plurality of first and second light emitting devices 7 and 10, a transparent layer 29, a medium layer 13 and the wavelength conversion layer 18.

Another transparent layer 20 may be further disposed on the wavelength conversion layer 18.

For the purpose of convenience of explanation, the transparent layer 29 will be referred to as a first transparent layer and the transparent layer 20 will be referred to as a second transparent layer.

The second transparent layer 20 may have the refractive index lower than the refractive index of the wavelength conversion layer 18.

The second transparent layer 20, for instance, may include a silicone-based resin or an epoxy-based resin having superior light transmittance, thermal endurance and thermal conductivity, but the embodiment is not limited thereto.

For instance, the silicone-based resin may have the refractive index of 1.42 to 1.60 and the epoxy-based resin may have the refractive index of 1.5, but the embodiment is not limited thereto.

In addition, the wavelength conversion layer 18 may be formed of glass having the refractive index of 1.89, and the second transparent layer 20 may be formed of the epoxy-based resin having the refractive index of 1.5.

When the wavelength conversion layer 18 directly contacts external atmospheric pressure, the light of the wavelength conversion layer 18 may not be readily output to the outside due to the great difference in refractive index between the wavelength conversion layer 18 and the atmosphere.

In order to solve the above problem, the second transparent layer 20 having the refractive index between the refractive index of the wavelength conversion layer 18 and the refractive index of the atmosphere may be provided to attenuate the great difference in refractive index between the wavelength conversion layer 18 and the atmosphere. That is, the second transparent layer 20 may have the refractive index lower than the refractive index of the wavelength conversion layer 18 and higher than the refractive index of the atmosphere. Thus, the light of the wavelength conversion layer 18 may be readily output to the outside by way of the second transparent layer 20.

The second transparent layer 20 may include a plurality of transparent films to maximally attenuate the difference in refractive index. In this case, the transparent films may have different indexes, which are linearly or nonlinearly reduced from the wavelength conversion layer 18 to the outside.

Figure 14:
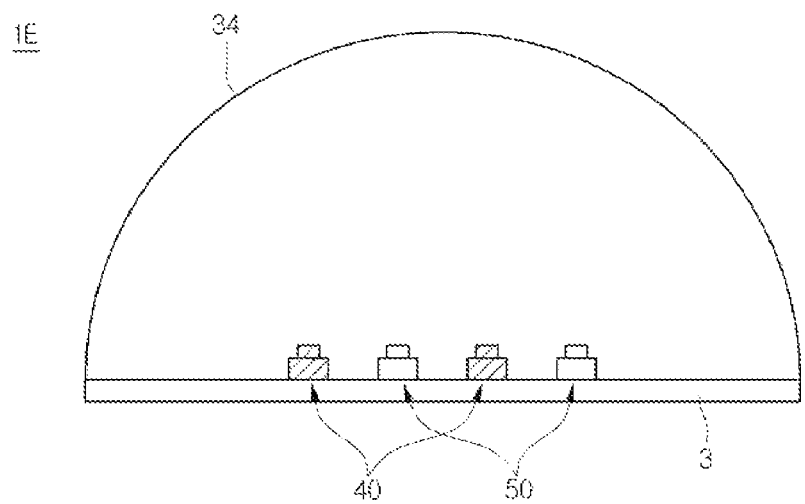
FIG. 14 is a sectional view showing a light emitting apparatus according to the sixth embodiment.

FIG. 14 is a sectional view showing a light emitting apparatus according to the sixth embodiment.

Referring to FIG. 14, the light emitting apparatus 1 E according to the sixth embodiment may include a substrate 3, a plurality of first and second light emitting packages 40 and 50, and a transparent layer 34.

The substrate 3 has been described in detail in the first embodiment, so the detailed description thereof will be omitted. The substrate 3 may be easily comprehended from the description of the first embodiment.

Figure 15:
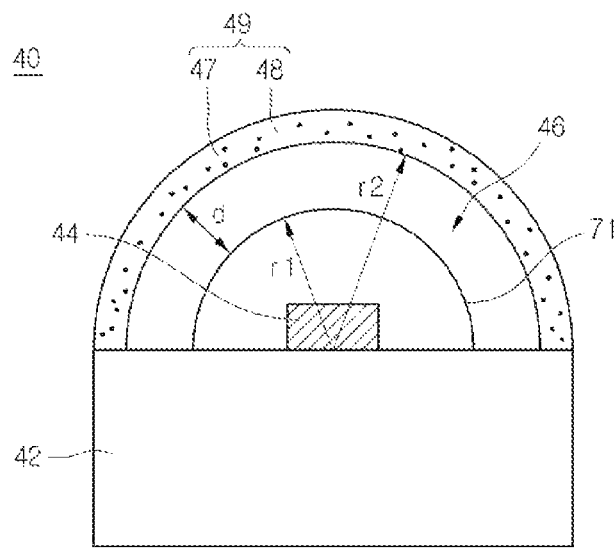
FIG. 15 is a first example view showing a first light emitting package of FIG. 14.

The transparent layer 34 may be disposed on a wavelength conversion layer 49 of the first light emitting package 50 shown in FIG. 15.

Similar to the transparent layer 20 shown in FIG. 13, the transparent layer 34 may have the refractive index lower than the refractive index of the wavelength conversion layer 49.

The transparent layer 34 may be formed of a silicone-based resin or an epoxy-based resin having superior adhesive and thermal conductive properties, but the embodiment is not limited thereto.

The first and second light emitting packages 40 and 50 may be attached onto the substrate 3 by using an adhesive.

The first light emitting package 40 may serve as a first light source for generating light having a first main wavelength band and light having a third main wavelength band and the second light emitting package 50 may serve as a second light source for generating light having a second main wavelength band, but the embodiment is not limited thereto.

The first light emitting package 40 may include a first light emitting device for generating the light having the first main wavelength band and a wavelength conversion layer for converting the light having the first main wavelength band into the light having the third main wavelength band. The second light emitting package 50 may include a second light emitting device for generating the light having the second main wavelength band For instance, the first main wavelength band may be in the range of about 400 nm to about 500 nm, the second main wavelength band may be in the range of about 600 nm to about 670 nm, and the third main wavelength band may be in the range of about 500 nm to about 600 nm, but the embodiment is not limited thereto.

In addition, the first main wavelength band may have a peak of 450 nm, the second main wavelength band may have a peak of 615 nm, and the third main wavelength band may have a peak in the range of 550 nm to 560 nm, but the embodiment is not limited thereto.

Therefore, the warm white light may be generated by mixing the light having the first main wavelength band and the light having the third main wavelength band, which are generated from the first light emitting package 40, with the light having the second main wavelength band generated from the second light emitting package 50, but the embodiment is not limited thereto.

Figure 16:
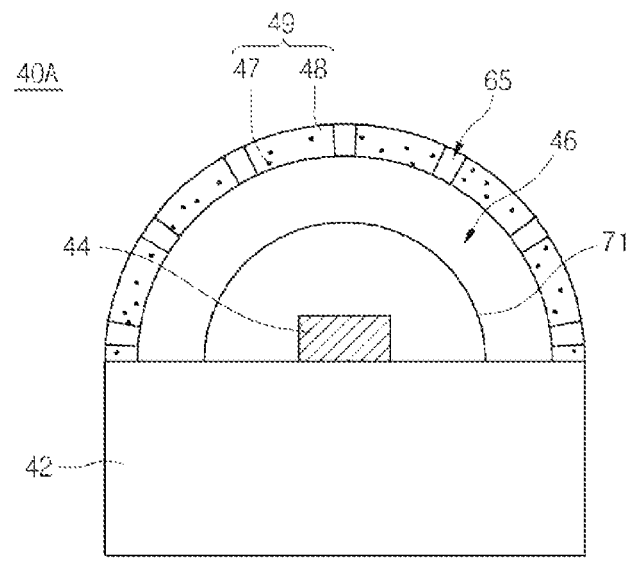
FIG. 16 is a second example view showing a first light emitting package of FIG. 14.
Figure 17:
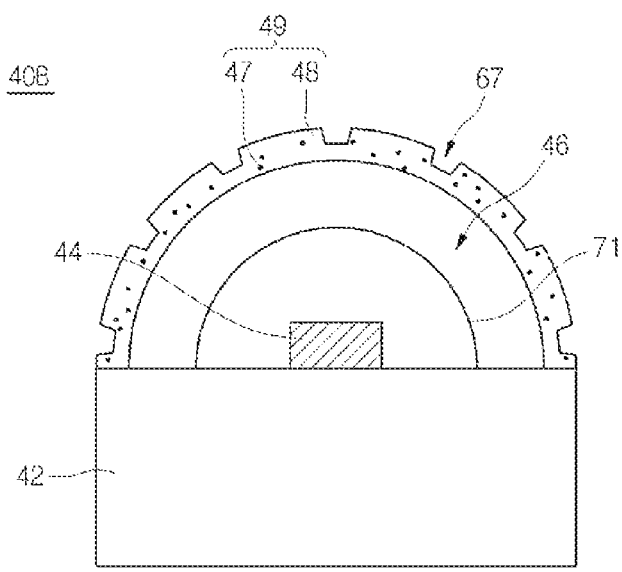
FIG. 17 is a third example view showing a first light emitting package of FIG. 14.

The first light emitting package 40, as shown in FIGS. 15 to 17, may be modified to have various structures.

As shown in FIGS. 15 to 17, the light emitting package 40 includes a body 42 as well as a first light emitting device, a medium layer, a transparent layer and a wavelength conversion layer, which are substantially identical to the first light emitting device 7, the medium layer 13, the transparent layer 29 and the wavelength conversion layer 18 according to the first embodiment, so the description thereof will be omitted.

Although not shown in FIGS. 15 to 17, the first light emitting package 40 may include first and second electrode lines formed on the body 42 to electrically connect the first light emitting package 40 to the first light emitting device 44.

A reflective layer may be coated on the first and second electrode lines and/or the body to improve the light efficiency by reflecting the light generated from the first light emitting device 44.

Details of the elements, which are not described below, may be easily comprehended by referring to the description of the corresponding elements of the first embodiment.

As shown in FIG. 15, the first light emitting package 40 may include the body 42, the first light emitting device 44, the transparent layer 71, the medium layer 46 and the wavelength conversion layer 49.

The body 42 may serve as a substrate to support the first light emitting device 44.

The body 42 may include a silicon material, a synthetic resin material or a metallic material, but the embodiment is not limited thereto.

Although the body 42 has the flat top surface in FIG. 15, a cavity may be formed in the top surface of the body 42 and the first light emitting device 44 may be disposed on a bottom surface of the body 42.

The first light emitting device 44 may be attached to the first and second electrode lines of the body 42 through the flip chip bonding or die bonding, but the embodiment is not limited thereto.

The first light emitting device 44 may be formed of group II-VI semiconductor materials or group III-V compound semiconductor materials to generate the light having the first main wavelength band.

The transparent layer 71 is attached onto the body 42 while surrounding the first light emitting device 44. Thus, the first light emitting device 44 is securely fixed to the body 44 so that the first light emitting device 44 can be prevented from being detached from the body by external impact and can be prevented from being contaminated or eroded by air of the medium layer 46.

The transparent layer 71 may have the refractive index between the refractive indexes of the first light emitting device 44 and the medium layer 46. That is, the transparent layer 71 may have the refractive index lower than the refractive index of the first light emitting device 44 and higher than the refractive index of the medium layer 46.

The transparent layer 71 may attenuate the difference in refractive index between the first light emitting device 44 and the medium layer 46, so the light of the first light emitting device 44 can be more readily incident into the medium layer 46.

The wavelength conversion layer 49 may be spaced apart from the transparent layer 71 while interposing the medium layer 46 therebetween.

The wavelength conversion layer 49 may have the refractive index higher than that of the medium layer 46. Thus, the light travelled to the medium layer 46 from the first light emitting device 44 can be incident into the wavelength conversion layer 49 without light loss, so that the wavelength conversion efficiency of the wavelength conversion layer 49 can be maximized.

The wavelength conversion layer 49 may include a transparent film 48 and a plurality of wavelength conversion particles 47 dispersed in the transparent film 48.

The light generated from the first light emitting device 44 may be converted into the light having the third main wavelength band by the wavelength conversion particles 47. In addition, the light generated from the first light emitting device 44 may be output to the outside through spaces defined between the wavelength conversion particles 47 and the transparent film 48.

Thus, the first light emitting device 44 can output the light having the first main wavelength band and the light having the third main wavelength band. As the light having the first main wavelength band is mixed with the light having the third main wavelength band, the greenish light may be seen to the naked eyes of the user, but the embodiment is not limited thereto.

Meanwhile, when the transparent layer 71 has a first radius $r_1$ and the wavelength conversion layer 49 has a second radius $r_2$, the medium layer 46 may have a width D defined as a difference between the second radius $r_2$ of the wavelength conversion layer 49 and the first radius $r_1$ of the transparent layer 71.

In this case, the medium layer 46 may be formed to have a width d defined between the second radius $r_2$ of the wavelength conversion layer 49 and the first radius $r_1$ of the transparent layer 71.

The width d may be uniformly formed over the whole area between the wavelength conversion layer 49 and the transparent layer 71, but the embodiment is not limited thereto.

As shown in FIG. 16, a first light emitting package 40A may include a body 42, a first light emitting device 44, a transparent layer 71, a medium layer 46 and a wavelength conversion layer 49.

The wavelength conversion layer 49 may include a plurality of holes 65 spaced apart from each other.

The holes 65 may be formed through the bottom surface and the top surface of the wavelength conversion layer 49.

The holes 65 may have an area corresponding to 10% to 30% based on the whole area of the wavelength conversion layer 49.

The first light emitting package 40A shown in FIG. 16 may improve the light extraction efficiency by forming the holes 65 in the wavelength conversion layer 49.

The holes 65 may have circular shapes, triangular shapes, rectangular shapes, star shapes or lozenge shapes when viewed from the top.

The holes 65 may have the same size or diameter or different sizes or diameters.

For instance, the holes 65 formed in the center region of the wavelength conversion layer 49 may have relatively small sizes or diameters and the holes 65 formed in the peripheral region of the wavelength conversion layer 49 may have relatively large sizes or diameters.

In addition, the sizes or diameters of the holes 65 may be gradually enlarged linearly or nonlinearly from the center region of the wavelength conversion layer 49 to the peripheral region of the wavelength conversion layer 49.

For instance, the holes 65 may be formed only in the peripheral region of the wavelength conversion layer 49 without being foamed in the center region of the wavelength conversion layer 49.

As shown in FIG. 17, a first light emitting package 40B may include a body 42, a first light emitting device 44, a transparent layer 71, a medium layer 46 and a wavelength conversion layer 49.

The wavelength conversion layer 49 may include a plurality of grooves 67 instead of the holes 65 shown in FIG. 16. The grooves 67 may be spaced apart from each other in the top surface of the wavelength conversion layer 49.

The grooves 67 may have an area corresponding to 10% to 30% based on the whole area of the wavelength conversion layer 49.

The grooves 67 have depths that may vary depending on positions in the wavelength conversion layer 49. For instance, the depth of the groove 67 in the peripheral region of the wavelength conversion layer 49 may be greater than the depth of the groove 67 in the center region of the wavelength conversion layer 49. Otherwise, the depth of the groove 67 in the center region of the wavelength conversion layer 49 may be greater than the depth of the groove 67 in the peripheral region of the wavelength conversion layer 49.

The grooves 67 have sizes or diameters that may vary depending on positions in the wavelength conversion layer 49. For instance, the sizes or diameters of the groove 67 in the peripheral region of the wavelength conversion layer 49 may be greater than the sizes or diameters of the groove 67 in the center region of the wavelength conversion layer 49. Otherwise, the sizes or diameters of the groove 67 in the center region of the wavelength conversion layer 49 may be greater than the sizes or diameters of the groove 67 in the peripheral region of the wavelength conversion layer 49.

Figure 18:
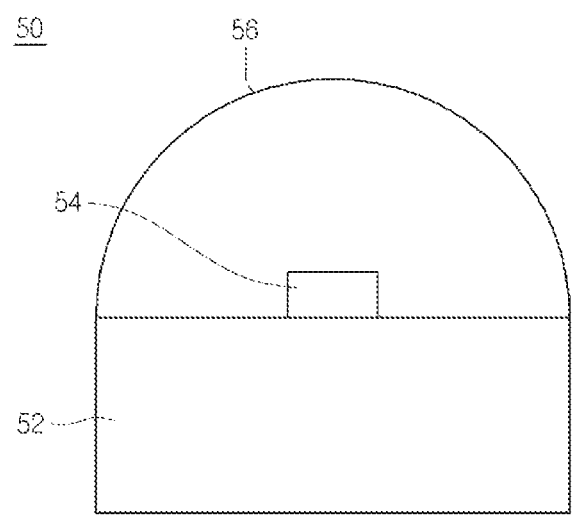
FIG. 18 is a sectional view showing a second light emitting package of FIG. 14.

FIG. 18 is a sectional view showing a second light emitting package of FIG. 14.

The second light emitting package 50 may include a body 52, a second light emitting device 54, and a transparent layer 56.

The body 52 may serve as a substrate to support the second light emitting device 54.

The body 52 may include a silicon material, a synthetic resin material or a metallic material, but the embodiment is not limited thereto.

Although the body 52 has the flat top surface, a cavity may be formed in the top surface of the body 52 and the second light emitting device 54 may be disposed on a bottom surface of the body 52.

The second light emitting device 54 may be formed of group II-VI semiconductor materials or group III-V compound semiconductor materials to generate the light having the second main wavelength band.

The transparent layer 56 may include an epoxy-based resin or a silicon resin having superior transmittance and insulating properties, but the embodiment is not limited thereto.

When viewed from the side surface, the transparent layer 56 may have a hemispherical shape, but the embodiment is not limited thereto.

Although not shown in the drawing, a recess may be formed at the center region of the top surface of the transparent layer 56, but the embodiment is not limited thereto.

The top surface of the transparent layer 56 may be formed with a roughness structure or a texture to improve the light extraction efficiency, but the embodiment is not limited thereto.

Figure 19:
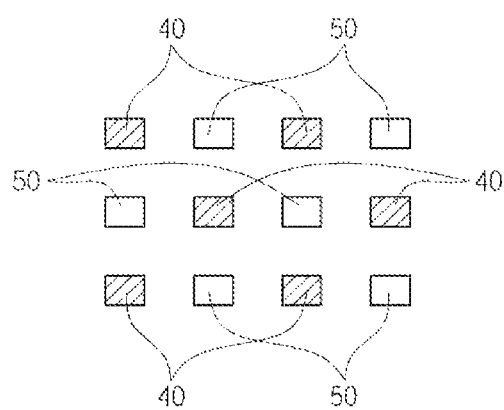
FIG. 19 is a first example view showing an arrangement of a light emitting package of FIG. 14.
Figure 20:
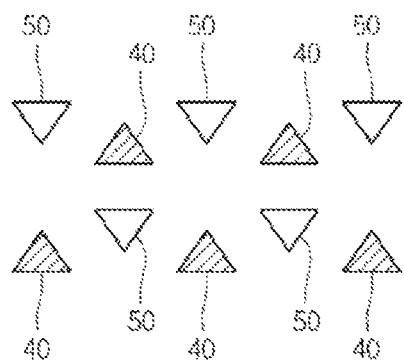
FIG. 20 is a second example view showing an arrangement of a light emitting package of FIG. 14.
Figure 21:
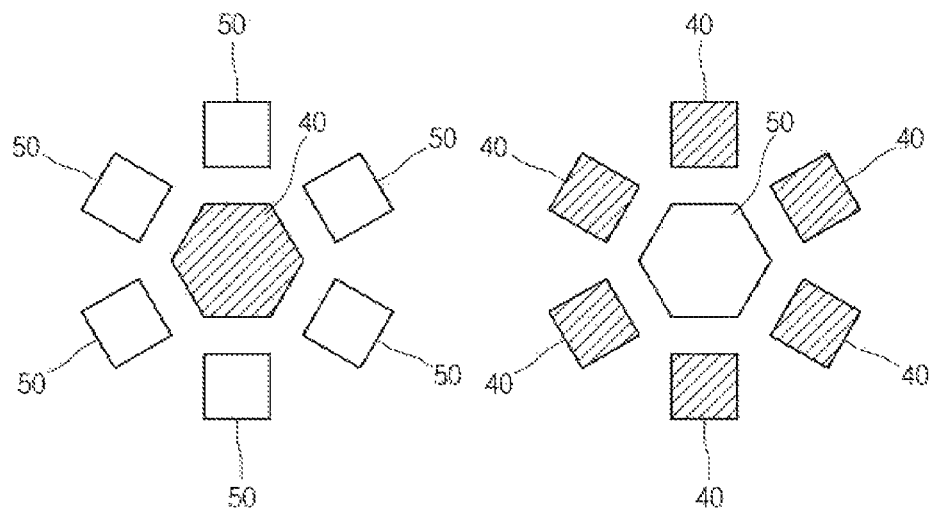
FIG. 21 is a third example view showing an arrangement of a light emitting package of FIG. 14.

FIGS. 19 to 21 are views showing an arrangement of the first and second light emitting packages.

Figure 4:
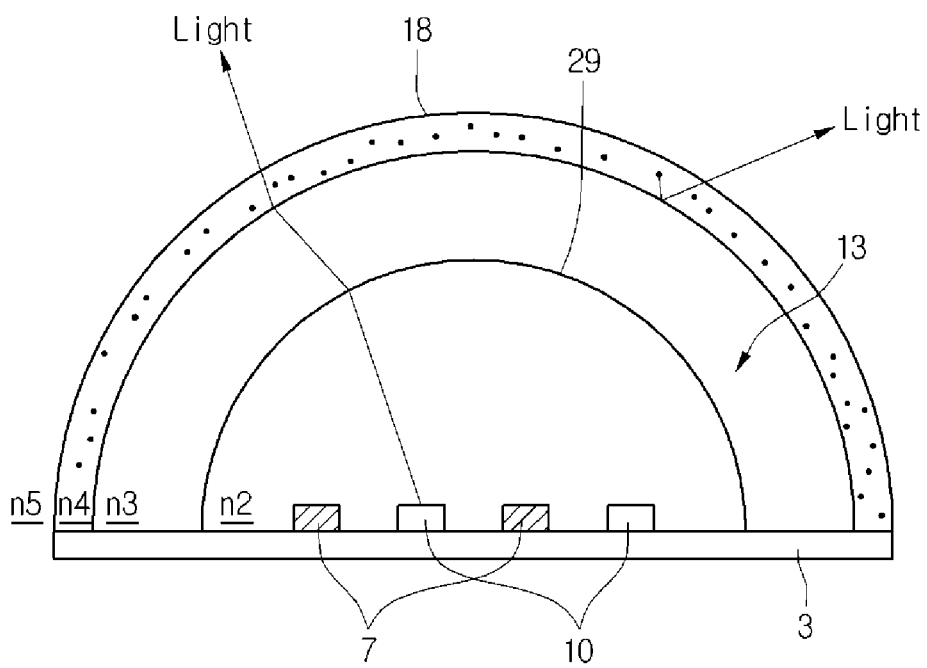
FIG. 4 is a view showing a traveling path of light between a medium layer and a wavelength conversion layer according to the first embodiment.

The arrangement of the first and second light emitting packages 40 and 50 shown in FIGS. 19 to 21 are substantially identical to the arrangement of the first and second light emitting devices 7 and 10 shown in FIGS. 2 to 4.

Thus, the arrangement of the first and second light emitting packages 40 and 50 shown in FIGS. 19 to 21 can be readily comprehended from the arrangement of the first and second light emitting devices 7 and 10 shown in FIGS. 2 to 4, so the detailed description thereof will be omitted.

Figure 22:
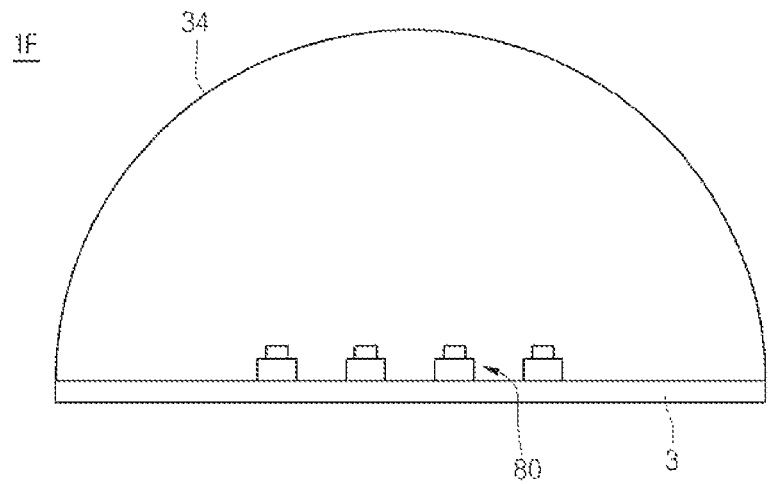
FIG. 22 is a sectional view showing a light emitting apparatus according to the seventh embodiment.

FIG. 22 is a sectional view showing a light emitting apparatus according to the seventh embodiment.

The seventh embodiment is substantially identical to the sixth embodiment shown in FIG. 14 except for a light emitting package 80.

Different from the sixth embodiment, in which the warm white light is generated by the first and second light emitting packages 40 and 50, the warm white light is generated by the single light emitting package 80 in the seventh embodiment.

The contents omitted in the following description may be easily comprehended by referring to the first and sixth embodiments.

In the following description of the seventh embodiment, reference numerals assigned to the elements of the first and sixth embodiments will be used to refer to the elements of the seventh embodiment if they have the same functions and detailed description thereof will be omitted.

Referring to FIG. 22, the light emitting apparatus IF according to the seventh embodiment may include a substrate 3, a plurality of light emitting packages 80 and a transparent layer 34.

The light emitting packages 80 may be attached to the substrate 3 while being spaced apart from each other.

The transparent layer 34 may be disposed on the substrate 3 to surround the light emitting packages 80.

Figure 23:
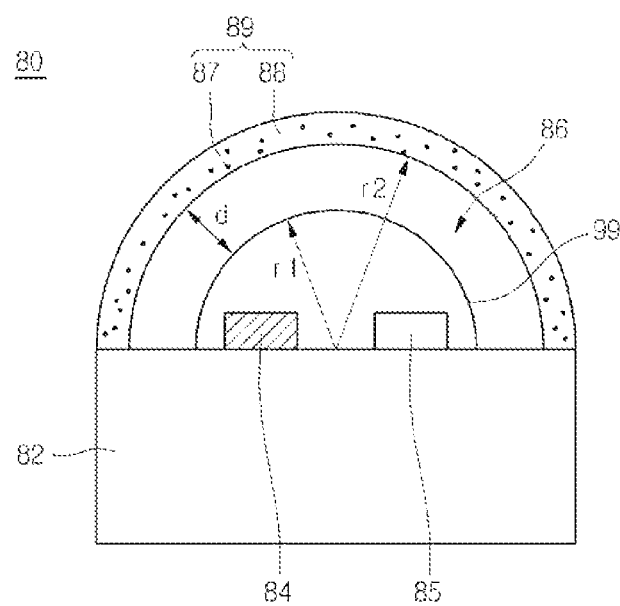
FIG. 23 is a first example view showing a light emitting package of FIG. 22.

The transparent layer 34 may be disposed on a wavelength conversion layer 89 of the light emitting package 80 shown in FIG. 23 as well as on the substrate 3.

Similar to the transparent layer 20 shown in FIG. 13, the transparent layer 34 may have the refractive index lower than the wavelength conversion layer 89.

The transparent layer 34 may be formed of a silicone-based resin or an epoxy-based resin having superior adhesive and thermal conductive properties, but the embodiment is not limited thereto.

The transparent layer 34 may be directly formed on the substrate 3 through the forming process.

In addition, the transparent layer 34 may be attached onto the substrate after processing the transparent layer 34 to have a hemispheric structure, but the embodiment is not limited thereto. In this case, the bottom surface of the transparent layer 34 may be formed with a recess corresponding to the shape of the light emitting package 80.

The light emitting package 80 may generate the warm white light by mixing the light having the first main wavelength band, the light having the second main wavelength band and the light having the third main wavelength band.

For instance, the first main wavelength band may be in the range of about 400 nm to about 500 nm, the second main wavelength band may be in the range of about 600 nm to about 670 nm, and the third main wavelength band may be in the range of about 500 nm to about 600 nm, but the embodiment is not limited thereto.

In addition, the first main wavelength band may have a peak of 450 nm, the second main wavelength band may have a peak of 615 nm, and the third main wavelength band may have a peak in the range of 550 nm to 560 nm, but the embodiment is not limited thereto.

Therefore, the light emitting apparatus 1F according to the seventh embodiment can generate the warm white light by mixing the light having the first main wavelength band, the light having the second main wavelength band and the light having the third main wavelength band, but the embodiment is not limited thereto.

As shown in FIGS. 23 to 26, the light emitting package 80 includes a body 82 as well as a first light emitting device, a medium layer, a transparent layer and a wavelength conversion layer, which are substantially identical to the first light emitting device 7, the medium layer 13, the transparent layer 29 and the wavelength conversion layer 18 according to the first embodiment, so the description thereof will be omitted.

In addition, although not shown in FIGS. 23 to 26, the light emitting package 80 may further include first and second electrode lines electrically connected to the first and second light emitting devices 84 and 85, respectively.

A reflective layer may be coated on the first and second electrode lines or the body 82 to improve the light efficiency by reflecting the light generated from the first light emitting device 84 or the second light emitting device 85. The first and second electrode lines may serve as a heat dissipation member to discharge heat generated from the first light emitting device 84 or the second light emitting device 85 to the outside.

Details of the elements, which are not described above, may be easily comprehended by referring to the description of the corresponding elements of the first embodiment.

As shown in FIG. 23, the light emitting package 80 may include the body 82, a plurality of first and second light emitting devices 84 and 85, the transparent layer 99, the medium layer 86 and the wavelength conversion layer 89.

The body 82 may have a flat top surface or a cavity may be formed in the top surface of the body 82. The first and second light emitting devices 84 and 85 may be attached onto the flat top surface of the body 82 or the bottom surface of the cavity.

The first and second light emitting devices 84 and 85 may be attached onto the body 82 while being spaced apart from each other. In addition, the first and second light emitting devices 84 and 85 may be attached onto the electrode lines of the body 82 through the flip chip bonding or die bonding.

The first light emitting device 84 may serve as a first light source for generating light having a first main wavelength band and the second light emitting device 85 may serve as a second light source for generating light having a second main wavelength band, but the embodiment is not limited thereto.

The transparent layer 99 is attached onto the body 82 while surrounding the first and second light emitting devices 84 and 85. Thus, the first and second light emitting devices 84 and 85 can be more securely fixed to the body 82 so that the first and second light emitting devices 84 and 85 can be prevented from being detached from the body 82 by external impact and can be prevented from being contaminated or eroded by air of the medium layer 86.

The transparent layer 99 may have the refractive index between the refractive indexes of the first and second light emitting devices 84 and 85 and the medium layer 46. That is, the transparent layer 99 may have the refractive index lower than the refractive index of the first and second light emitting devices 84 and 85 and higher than the refractive index of the medium layer 86.

The transparent layer 99 may attenuate the difference in refractive index between the first and second light emitting devices 84 and 85 and the medium layer 86, so the light of the first and second light emitting devices 84 and 85 can be more readily incident into the medium layer 86.

The wavelength conversion layer 89 may be spaced apart from the transparent layer 99 while interposing the medium layer 86 therebetween.

The wavelength conversion layer 89 may have the refractive index higher than that of the medium layer 86. Thus, the light travelled to the medium layer 86 from the first and second light emitting devices 84 and 85 can be incident into the wavelength conversion layer 89 without light loss, so that the wavelength conversion efficiency of the wavelength conversion layer 89 can be maximized.

The wavelength conversion layer 89 may include a transparent film 88 and a plurality of wavelength conversion particles 87 dispersed in the transparent film 88.

The light having the first main wavelength band generated from the first light emitting device 84 or the light having the second main wavelength band generated from the second light emitting device 85 may be converted into the light having the third main wavelength band by the wavelength conversion particles 87.

The wavelength conversion particles 87 may include phosphors, but the embodiment is not limited thereto.

Meanwhile, when the transparent layer 99 has a first radius $r_1$ and the wavelength conversion layer 89 has a second radius $r_2$, the medium layer 86 may have a width d defined between the second radius $r_2$ of the wavelength conversion layer 89 and the first radius $r_1$ of the transparent layer 99.

In this case, the width d may correspond to a distance between the top surface of the transparent layer 99 and the bottom surface of the wavelength conversion layer 89.

Figure 24:
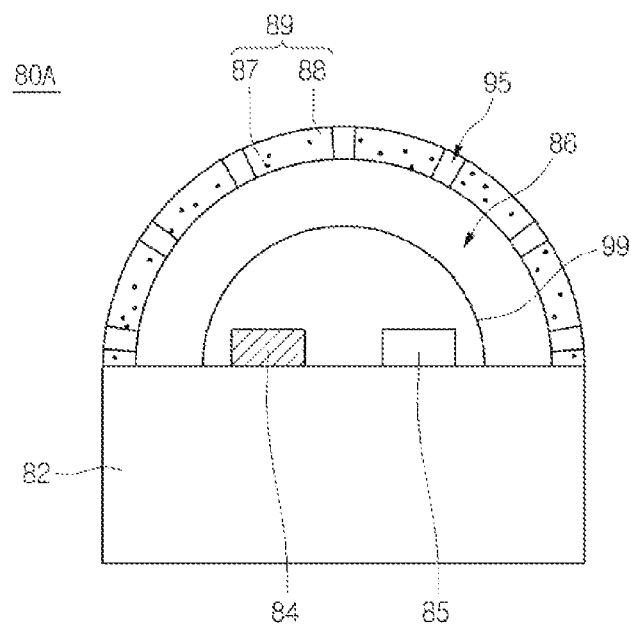
FIG. 24 is a second example view showing a light emitting package of FIG. 22.

As shown in FIG. 24, a light emitting package 80A may include the body 82, the first and second light emitting devices 84 and 85, the transparent layer 99, the medium layer 86 and the wavelength conversion layer 89.

The wavelength conversion layer 89 may include a plurality of holes 95 spaced apart from each other.

The holes 95 may be formed through the bottom surface and the top surface of the wavelength conversion layer 89.

The holes 95 may have an area corresponding to 10% to 30% based on the whole area of the wavelength conversion layer 89.

The light emitting package 80A shown in FIG. 24 may improve the light extraction efficiency by forming the holes 95 in the wavelength conversion layer 89.

The holes 95 may have circular shapes, triangular shapes, rectangular shapes, star shapes or lozenge shapes when viewed from the top.

The holes 95 may have the same size or diameter or different sizes or diameters.

For instance, the holes 95 formed in the center region of the wavelength conversion layer 89 may have relatively small sizes or diameters and the holes 95 formed in the peripheral region of the wavelength conversion layer 89 may have relatively large sizes or diameters.

In addition, the sizes or diameters of the holes 95 may be gradually enlarged linearly or nonlinearly from the center region of the wavelength conversion layer 89 to the peripheral region of the wavelength conversion layer 89.

For instance, the holes 95 may be formed only in the peripheral region of the wavelength conversion layer 89 without being formed in the center region of the wavelength conversion layer 89.

Figure 25:
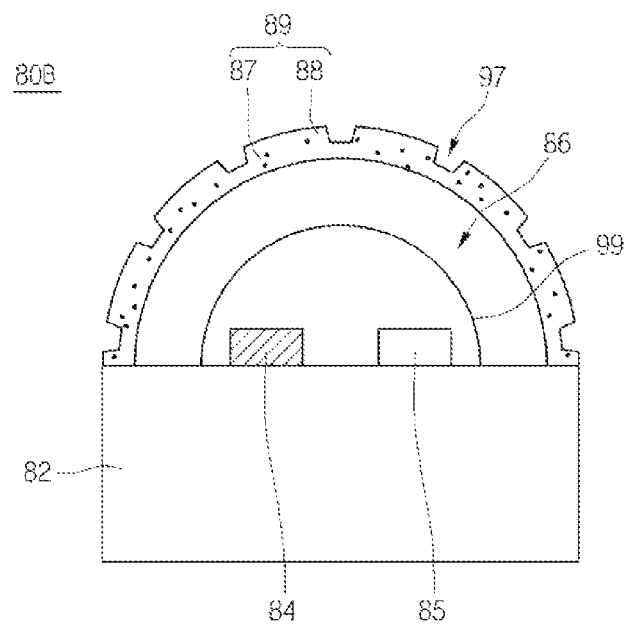
FIG. 25 is a third example view showing a light emitting package of FIG. 22.

As shown in FIG. 25, a light emitting package 80B may include a body 82, first and second light emitting devices 84 and 85, a transparent layer 99, a medium layer 86 and a wavelength conversion layer 89.

The wavelength conversion layer 89 may include a plurality of grooves 97 instead of the holes 95 shown in FIG. 24. The grooves 97 may be spaced apart from each other in the top surface of the wavelength conversion layer 89.

The grooves 97 may have an area corresponding to 10% to 30% based on the whole area of the wavelength conversion layer 89.

The grooves 97 have depths that may vary depending on positions in the wavelength conversion layer 89. For instance, the depth of the groove 97 in the peripheral region of the wavelength conversion layer 89 may be greater than the depth of the groove 97 in the center region of the wavelength conversion layer 89. Otherwise, the depth of the groove 97 in the center region of the wavelength conversion layer 89 may be greater than the depth of the groove 97 in the peripheral region of the wavelength conversion layer 89.

The grooves 97 have sizes or diameters that may vary depending on positions in the wavelength conversion layer 89. For instance, the sizes or diameters of the groove 97 in the peripheral region of the wavelength conversion layer 89 may be greater than the sizes or diameters of the groove 97 in the center region of the wavelength conversion layer 89. Otherwise, the sizes or diameters of the groove 97 in the center region of the wavelength conversion layer 89 may be greater than the sizes or diameters of the groove 97 in the peripheral region of the wavelength conversion layer 89.

Figure 26:
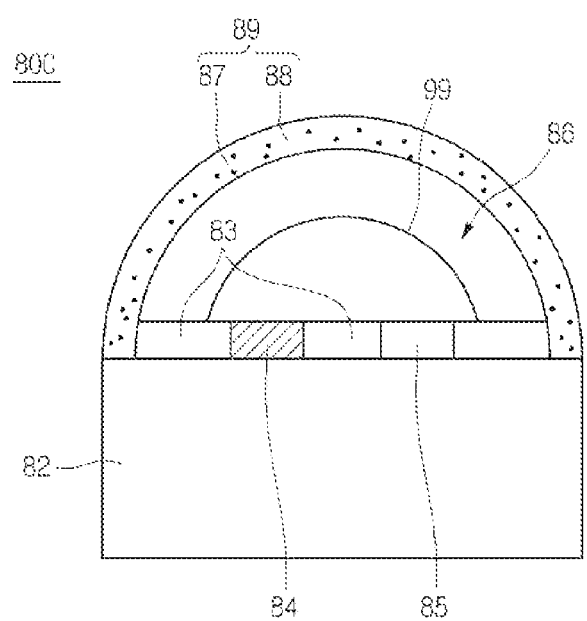
FIG. 26 is a fourth example view showing a light emitting package of FIG. 22.

As shown in FIG. 26, a light emitting package 80C may include a body 82, first and second light emitting devices 84 and 85, a transparent layer 99, a medium layer 86 and a wavelength conversion layer 89.

A diffusion layer 83 may be disposed between the transparent layer 99 and the body 82.

The diffusion layer 83 can contact side surfaces of the first and second light emitting devices 84 and 85. In detail, the diffusion layer 83 may be disposed on a region (hereinafter, referred to as a second region) of the body 82 except for a first region of the body 82 where the first and second light emitting devices 84 and 85 are attached.

A side surface of the diffusion layer 83 can contact an inner area of the wavelength conversion layer 89 fixed to the body 82.

The top surface of the diffusion layer 83 may be disposed on the same plane with the top surface of the first and second light emitting devices 84 and 85 or higher/lower than the top surface of the first and second light emitting devices 84 and 85, but the embodiment is not limited thereto. Thus, the whole area of the side surfaces of the first and second light emitting devices 84 and 85 can contact the diffusion layer 83.

For instance, the top surface of the diffusion layer 83 may be located at a half of the side surface of the first and second light emitting devices 84 and 85, but the embodiment is not limited thereto.

The diffusion layer 83 may include a transparent film and a plurality of dispersion particles dispersed in the transparent film, but the embodiment is not limited thereto.

The transparent film may include one selected from the group consisting of a silicone-based resin, a white epoxy-based resin, and PTFE (polytetrafluoroethylene), which have superior electric insulating property, thermal endurance and thermal conductivity, but the embodiment is not limited thereto.

The dispersion particles may include one selected from the group consisting of $TiO_2$, $Al_2O_3$, $BaCO_3$, $BaSO_4$ and $SiO_2$, but the embodiment is not limited thereto.

The dispersion particles may have superior dispersion property with respect to the light having the first main wavelength band (about 400 nm to about 500 nm) generated from the first light emitting device 84.

In general, if the light having the first main wavelength band (about 400 nm to about 500 nm) generated from the first light emitting device 84 reaches the second light emitting device 85 that generates the light having the second main wavelength band (about 600 nm to about 670 nm), the light having the first main wavelength band is absorbed in the second light emitting device 85, so the quantity of the light having the first main wavelength band may be reduced.

According to the light emitting package 80C, the diffusion layer 83 may closely adhere to the side surface of the first and second light emitting devices 84 and 85. Thus, the light having the first main wavelength band, which travels toward the side surface of the first light emitting device 84, may be scattered, dispersed or reflected by the diffusion layer 83 so that the light does not reach the second light emitting device 85. Accordingly, the quantity of the light having the first main wavelength band generated from the first light emitting device 84 may not be reduced.

Meanwhile, the light having the first main wavelength band generated from the first light emitting device 84 or the light having the second main wavelength band generated from the second light emitting device 85 may be output to the outside through the wavelength conversion layer 89 by way of the medium layer 86 or may be reflected from the wavelength conversion layer 89 so that the light may travel in the downward direction by way the medium layer 86.

The light traveling in the downward direction may be again scattered, dispersed or reflected by the diffusion layer 83 so that the light may travel in the upward direction. Thus, the light loss caused by the absorption of light in the body 82 can be minimized, so that the light efficiency can be improved.

The embodiment provides the first light source for generating the light having the first main wavelength band, the second light source for generating the light having the second main wavelength band, and the wavelength conversion layer for converting the light having the first main wavelength band or the light having the second main wavelength band into the light having the third main wavelength band, so that the warm white light can be readily produced.

According to the embodiment, a plurality of holes or grooves can be formed in the wavelength conversion layer, so that the light extraction efficiency can be improved.

According to the embodiment, the transparent layer is attached onto the substrate while surrounding the light emitting device, so that the light emitting device can be prevented from being detached from the substrate and can be prevented from being contaminated or eroded.

According to the embodiment, the diffusion layer may closely adhere to the side surface of the first light emitting device adjacent to the second light emitting device. Thus, the light having the first main wavelength band, which travels toward the side surface of the first light emitting device, does not reach the second light emitting device and the light, which is generated from the first light emitting device or the second light emitting device and reflected downward by the wavelength conversion layer, can be again in the upward direction, so the loss of light having the first main wavelength band can be minimized, thereby improving the light efficiency.

According to the embodiment, the warm white light having the higher color rendering index and the color temperature in the range of 2500 K to 4000 K can be generated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus comprising:
   a sub-mount;
   a first light source on the sub-mount to generate a light having a first main wavelength band in a range of about 400 nm to about 500 nm;
   a second light source on the sub-mount to generate a light having a second main wavelength band in a range of about 600 nm to about 670 nm, the second light spaced apart from the first light source;
   a first transparent layer surrounding the first and second light sources;
   a wavelength conversion layer on the first transparent layer to convert at least one of the light having the first main wavelength band or the light having the second main wavelength band into a light having a third main wavelength band in a range of about 500 nm to about 600 nm;
   a diffusion layer on the sub-mount; and
   a medium layer between the wavelength conversion layer and the first transparent layer,
   wherein at least one of the first or second light sources has a first refractive index, the first transparent layer has a second refractive index, the medium layer has a third refractive index, and the wavelength conversion layer has a fourth refractive index,
   wherein the first to fourth refractive indexes are different from each other,
   wherein a lower surface of the first transparent layer and an edge of the medium layer contact a top surface of the diffusion layer,
   wherein an outside portion of the diffusion layer contacts an inside portion of the wavelength conversion layer, and
   wherein the medium layer has a width in range of 0.5 mm to 50 mm.

2. The light emitting apparatus of claim 1, wherein the second refractive index is in a range of 1.4 to 1.6, the third refractive index is in a range of 1 to 1.3, and the fourth refractive index is in a range of 1.4 to 2.0.

3. The light emitting apparatus of claim 1, further comprising a second transparent layer on the wavelength conversion layer.

4. The light emitting apparatus of claim 3, wherein the second transparent layer has a fifth refractive index lower than the fourth refractive index.

5. The light emitting apparatus of claim 3, wherein the second transparent layer comprises a plurality of transparent films having different refractive indexes.

6. The light emitting apparatus of claim 1,
   wherein the diffusion layer contacts a side surface of at least one of the first or second light sources.

7. The light emitting apparatus of claim 6, wherein a top surface of the. diffusion layer is coplanar with a top surface of at least one light source.

8. The light emitting apparatus of claim 1, wherein the first transparent layer has a curvature of a first radius, and the wavelength conversion layer has a curvature of a second radius,
   wherein the medium layer has a width corresponding to a difference between the second radius and the first radius.

9. The light emitting apparatus of claim 8, wherein at least one of the first transparent layer or the wavelength conversion layer has a hemispheric shape.

10. The light emitting apparatus of claim 1, wherein the wavelength conversion layer comprises:
    a transparent film; and
    a plurality of wavelength conversion particles dispersed in the transparent film.

11. The light emitting apparatus of claim 10, wherein the wavelength conversion particles comprise phosphors.

12. The light emitting apparatus of claim 1, wherein the wavelength conversion layer comprises at least one of holes, grooves or protrusions.

13. The light emitting apparatus of claim 12, wherein an area of the holes is 10% to 30% with respect to a whole area of the wavelength conversion layer.

14. The light emitting apparatus of claim 12, wherein the grooves have different depths depending on positions in the wavelength conversion layer.

15. The light emitting apparatus of claim 1, wherein the first and second light. sources comprise at least one of at least one light emitting device or at least one light emitting package.

16. The light emitting apparatus of claim 1, further comprising a texture on a top surface of the wavelength conversion layer.

17. A light emitting apparatus comprising:
    a sub-mount;
    a plurality of light emitting packages on the sub-mount; and
    a second transparent layer surrounding the light emitting packages on the sub-mount,
    wherein each of the light emitting packages comprises:
    a first light emitting device on the sub-mount to generate a light having a first main wavelength band in a range of about 400 nm to about 500 nm;
    a plurality of second light emitting device on the sub-mount to generate a light having a second main wavelength band in a range of about 600 nm to about 670 nm, the second light emitting device spaced apart from the first light emitting device;
    a first transparent layer surrounding the first and second light emitting devices;
    a wavelength conversion layer on the first transparent layer to convert at least one of the light having the first main wavelength band or the light having the second main wavelength band into a light having a third main wavelength band in a range of about 500 nm to about 600 nm;
    a diffusion layer on the sub-mount; and
    a medium layer between the wavelength conversion layer and the first transparent layer,
    wherein the first light emitting device has a first refractive index, the first transparent layer has a second refractive index, the medium layer has a third refractive index, and the wavelength conversion layer has a fourth refractive index,
    wherein the first to fourth refractive indexes are different from each other,
    wherein a lower surface of the first transparent layer and an edge of the medium layer contact a top surface of the diffusion layer,
    wherein an outside portion of the diffusion layer contacts an inside portion of the wavelength conversion layer, and
    wherein the medium layer has a width in range of 0.5 mm to 50 mm.

18. The light emitting apparatus of claim 17, wherein the diffusion layer contact a side surface of at least one of the first or second light emitting devices.

19. The light emitting apparatus of claim 17, wherein the first transparent layer has a curvature of a first radis, and the wavelength conversion layer has a curvature of a second radius, and wherein the medium layer has the width corresponding to a difference between the second radius and the first radius.

20. The light emitting apparatus of claim 17, wherein at least one of the first transparent layer or the wavelength conversion layer has a hemispheric shape.

* * * * *